United States Patent
Gienger

(10) Patent No.: US 10,209,284 B2
(45) Date of Patent: Feb. 19, 2019

(54) ADVANCED ANTENNA PERFORMANCE TESTING

(71) Applicant: Keysight Technologies, Inc., Minneapolis, MN (US)

(72) Inventor: Dean Gienger, Loveland, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 49 days.

(21) Appl. No.: 15/637,322

(22) Filed: Jun. 29, 2017

(65) Prior Publication Data

US 2019/0004102 A1  Jan. 3, 2019

(51) Int. Cl.
| | |
|---|---|
| *H04W 84/18* | (2009.01) |
| *G01R 29/10* | (2006.01) |
| *G01R 27/04* | (2006.01) |
| *H01Q 3/26* | (2006.01) |
| *H01Q 3/24* | (2006.01) |

(52) U.S. Cl.
CPC ........... *G01R 29/105* (2013.01); *G01R 27/04* (2013.01); *H01Q 3/247* (2013.01); *H01Q 3/2676* (2013.01)

(58) Field of Classification Search
CPC ...... G01R 29/105; G01R 27/04; H01Q 3/247; H01Q 3/2676
See application file for complete search history.

(56) References Cited

U.S. PATENT DOCUMENTS

| | | | |
|---|---|---|---|
| 8,824,588 B2 | 9/2014 | Emmanuel et al. | |
| 9,084,124 B2 | 7/2015 | Nickel et al. | |
| 2013/0141295 A1* | 6/2013 | Jiang | H01Q 9/0442 343/746 |
| 2013/0208608 A1* | 8/2013 | Piazza | H01Q 1/007 370/252 |
| 2017/0062943 A1* | 3/2017 | Patron | H01Q 3/443 |

FOREIGN PATENT DOCUMENTS

JP 2014-163716 A  9/2014

* cited by examiner

*Primary Examiner* — Hoang Nguyen
*Assistant Examiner* — Jae Kim

(57) ABSTRACT

A system for testing advanced antennas includes an antenna unit controller, a radio frequency instrument, and a test controller. The antenna unit controller is configured to connect to a device that includes an advanced antenna under test in an anechoic chamber. The radio frequency instrument is connected to a probe antenna in the anechoic chamber. The test controller is configured to control the test of the advanced antenna by controlling the antenna unit controller to reconfigure the advanced antenna under test, and by controlling the radio frequency instrument to communicate wirelessly with the device via the probe antenna in each of a sequence of multiple configurations of the advanced antenna while the advanced antenna remains in the anechoic chamber.

20 Claims, 14 Drawing Sheets

Automatic
Placement Support**

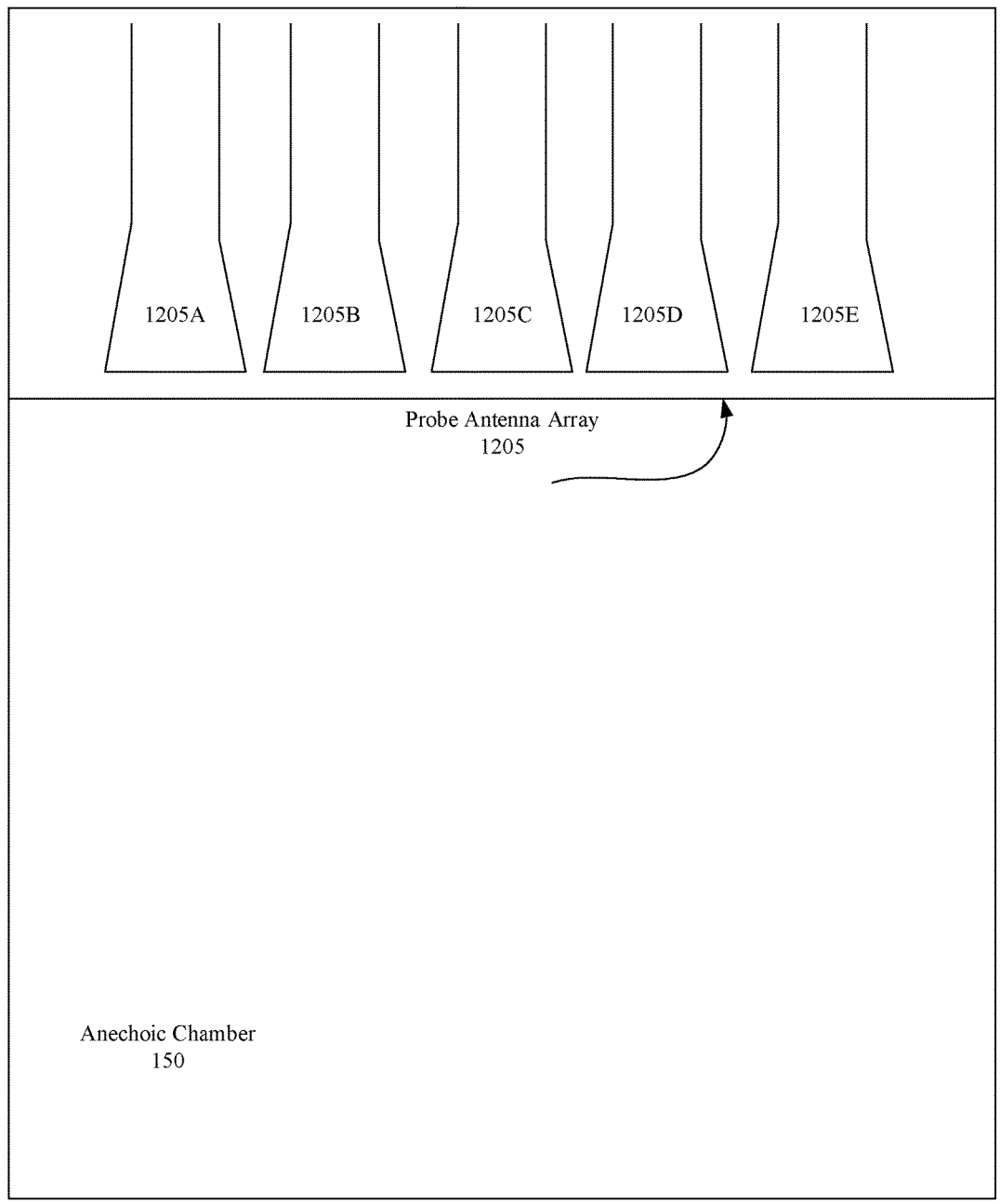

ADVANCED ANTENNA PERFORMANCE TESTING

BACKGROUND

In multiple-input multiple-output (MIMO) communications systems, multiple antennas are used on both a base station and on a mobile device to exploit a phenomenon known as multipath propagation in order to achieve higher data rates. In general, MIMO communications systems simultaneously send and receive multiple data signals over each radio channel. The multipath propagation phenomenon is the result of environmental factors that influence the data signals as they travel between the base station and the mobile device, including, for example, ionospheric reflection and refraction, atmospheric ducting, reflection from terrestrial objects and reflection from bodies of water. Because of these factors, the data signals experience multipath interference that results in constructive interference, destructive interference, or fading, and phase shifting of the data signals. MIMO technology has been standardized in various wireless communications standards including Institute of Electrical and Electronics Engineers (IEEE) 802.11n, IEEE 802.11ac, HSPA+(3G), WiMAX (4G) and Long Term Evolution (LTE) standards.

MIMO communications systems require testing. A typical MIMO test system for performing "conducted" testing of a base station includes a user equipment (UE) device or UE device emulator, the base station device under test (DUT), a test system computer, and various electrical cables for interconnecting the components. The antenna ports of the UE device or device emulator are typically connected to input ports of the fading emulator by electrical RF cables, or less frequently by electromagnetic coupling via a radiated air interface. Output ports of the fading emulator are connected to the DUT. The testing is referred to as "conducted" testing due to the wired connection between the output ports of the fading emulator and the DUT. The test system computer is typically connected to UE device or UE device emulator and to the fading emulator by respective electrical data cables, e.g., Ethernet cables. The test system computer is in communication with the base station DUT. During OTA testing, the test system computer receives information from the base station DUT that the test system computer processes to evaluate the transmit and/or receive capabilities of the base station DUT.

The next generation of wireless infrastructure (e.g., base stations, backbone, etc.) and customer handsets will fall under the so-called 5th generation standard(s) which are still being negotiated at the time of this application. The 5th generation standard(s) will cover mobile networks and wireless systems, and is expected to involve millimeter-wave frequency usage, compact phased arrays, and an unprecedented amount of electronic integration. Transmitters and receivers will be integrated into transceivers, and transceivers may be integrated with antenna arrays. This will be the case for both the UE devices and for the base stations. The 5G antenna array may be referred to hereinafter as an "advanced antenna", and the combined/integrated transceivers and antenna arrays may be referred to hereinafter as an "advanced antenna integrated radio".

Testing of the advanced antenna will be required in high volumes in order to ensure success of 5G communications systems. Conventional testing of antenna arrays in, for example base stations, requires physically large anechoic chambers and antenna positioners for either near-field or far-field scanning. The term "anechoic" means non-reflective, non-echoing, or echo-free, so an anechoic chamber is a chamber designed to completely absorb reflections of electromagnetic waves. The testing scan takes thousands of data points and requires physical movement of antenna positioners. Thus, conventional testing imposes significant costs in time, physical space, and equipment investment, and for 5G advanced antenna integrated radios may hinder adoption of the technology.

Moreover, the elements of an advanced antenna in 5G will be very small and there will be a very large number of such elements integrated together with other electrical components on the same circuit board. For example, the advanced antenna integrated radio may be integrated in the same printed circuit board (PCB) package or ball grid array (BGA) package. In other words, the entire advanced antenna integrated radio will be a single indivisible unit. For these reasons, conventional MIMO testing may not be feasible, or even possible, for 5G base stations and user equipment devices.

Nevertheless, radio manufacturers will want their advanced antennas tested for all of the usual characteristics, e.g., total transmit power, error vector magnitude (EVM) of modulation formats, antenna radiation pattern, etc. The non-separable nature of an advanced antenna integrated radio may render traditional testing methods useless.

The best MIMO test system that is currently available for testing base station DUTs is a multi-probe anechoic chamber (MPAC) over-the-air (OTA) test system. Other approaches include using a far field range, a compact antenna range, and near field range. In a typical multi-probe anechoic chamber, the base station DUT is located inside of a large anechoic chamber that also has a multi-probe antenna element configuration. Instead of the antenna elements of the base station DUT being physically connected to the output ports of the fading emulator, the probe antenna elements of the multi-probe antenna element configuration are connected to the output ports of the fading emulator to allow OTA testing rather than conducted testing of the base station DUT to be performed. However, the multi-probe anechoic chamber OTA test system has drawbacks in terms of cost and space requirements. One drawback is that the multi-probe anechoic chamber OTA testing method is a radiating far-field testing method that requires that probe antennas be positioned in the radiating far-field zone of the base station DUT, which, in the case of massive MIMO test systems and high frequencies (e.g., 28 GHz), may be several meters. Consequently, the anechoic chamber must be relatively large, typically requiring at least ten square meters of floor space, which leads to the anechoic chamber being very expensive.

The multi-probe anechoic chamber OTA test system also requires many probe antennas and many fading emulator channels to feed the probe antennas. The number of required probe antennas increases as a function of the number of clusters that are in the channel model, and in a multi-user case, also as a function of the number of users. Furthermore, a dynamic channel model that employs dynamic cluster angle evolution over time requires a very high number of probe antenna elements even in a single-user case that uses a relatively simple channel model. Consequently, it is anticipated that a multi-probe anechoic chamber OTA test system for testing 5G base stations will be extremely expensive due to the requirements for a very large anechoic chamber and an emulator having a very large number of channels.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 12 illustrates a probe antenna or probe antenna array in an anechoic chamber in the system for advanced array performance testing in FIG. 1 in accordance with a representative embodiment.

DETAILED DESCRIPTION

Figure 1:
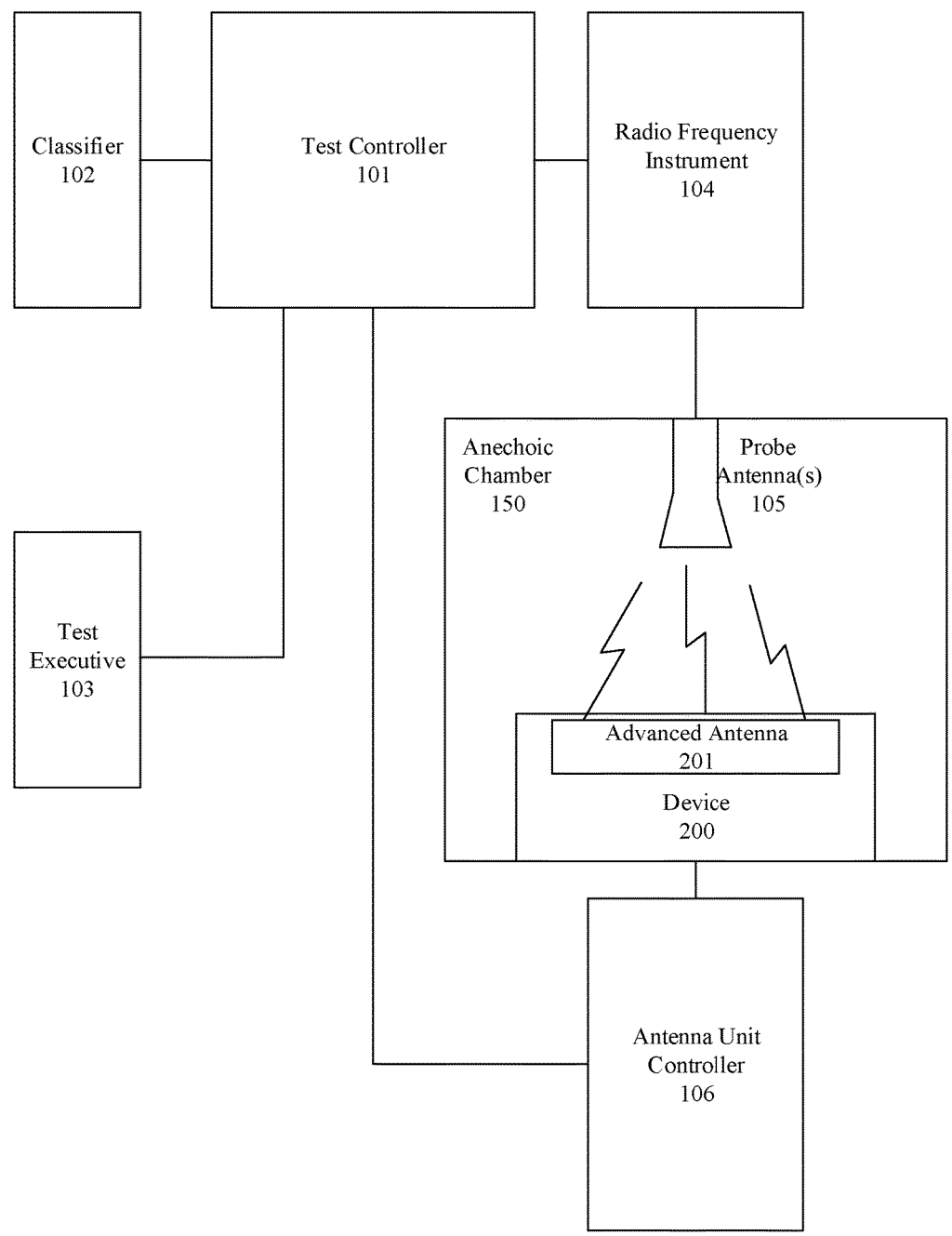
FIG. 1 is a schematic block diagram illustrating a system for advanced array performance testing in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only, and is not intended to be limiting. As used in the specification and appended claims, the singular forms of terms 'a', 'an' and 'the' are intended to include both singular and plural forms, unless the context clearly dictates otherwise. Additionally, the terms "comprise", "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

The present disclosure provides for testing in high volume manufacturing using smaller anechoic chambers, and without the need of positioners for physical movement (i.e., the DUT does not move during the test process). Using the new method testing can be accomplished in less time, using physically smaller chambers, and at lower equipment investment.

FIG. 1 is a schematic block diagram illustrating a system for advanced array performance testing in accordance with a representative embodiment. In FIG. 1, the system for advanced array performance testing includes a test controller 101, a classifier 102, and a test executive 103. The system for advanced array performance testing also includes a radio frequency instrument 104, an antenna unit controller 106, an anechoic chamber 150, and a probe antenna 105 or probe antennas (plural) in the anechoic chamber 150.

The test controller 101 may be embodied in a stand-alone computer dedicated to controlling testing of devices 200 (e.g., base stations) with an advanced antenna 201 in the anechoic chamber 150. Alternatively, a stand-alone computer may include the test controller 101, the classifier 102 and the test executive as combinations of software modules stored in memory of a stand-alone computer and a processor of the stand-alone computer that executes the instructions.

As explained below, the test controller 101 can orchestrate the radio frequency instrument 104 and antenna unit controller 106 to collect power measurements, and make decisions based on the results. Data and decisions can be provided to a test operator. For each measurement, the test controller 101 can configure the device 200 (e.g., device under test (DUT)) and/or advanced antenna 201 (e.g., advanced antenna under test (AUT)), and coordinate the emission and reception of RF signals by the advanced antenna 201 and probe antenna 105. The test controller 101 can sequence the advanced antenna 201 through test points where a beam formed by the advanced antenna 201 is adjusted/steered each time. The test controller 101 sends the results first to the classifier 102 for processing, and then receives the processing output from the classifier 102.

The advanced antenna 201 is an antenna with multiple radiating antenna elements that are each logically controllable and/or reconfigurable, or an antenna array with multiple individual radiating antennas that are each logically controllable and/or reconfigurable. Examples of an advanced antenna 201 described herein include an antenna array, a steerable beam antenna, a phased array, and a lens array antenna. Logically controllable and logically reconfigurable mean that each element of an antenna or each antenna in an array can be individually controlled and/or reconfigured, e.g., through operation of computer programming or logic algorithms, including being powered on and off at various times, and being active in any of multiple different power settings to emit different power levels, as well as to change phase and/or amplitude for each element of the antenna or antenna in the array. Radiated emissions from the elements of an antenna or antennas in an antenna array in the advanced antenna 201 are combined, and can be controlled to form different beamforms. Each configuration of the advanced antenna 201 may be taken to mean that one or more elements of an antenna or antennas in an antenna array are controlled differently than in another configuration such as by being powered on or off or at different levels.

The advanced antenna 201 is necessary for millimeter wave (mmWave) communications to be effective. The advanced antenna 201 is able to focus radio frequency (RF) energy in specific directions by forming RF beams, and steering the RF energy in different directions rapidly without mechanism changes. Thus, the terms logically controllable and logically reconfigurable are applicable to such an advanced antenna 201 inasmuch as it can be logically controlled and/or logically reconfigured in order form a radio frequency beam, i.e., beamforming. The logical control and reconfiguration allows rapid changes in direction of the beams formed by the advanced antenna 201. In order to test the advanced antenna 201, as hundreds or thousands of measurements may be taken for each position and configuration of the advanced antenna 201. Although not required, the advanced antenna 201 may be physically fixed so that it is mechanically stationary within the anechoic chamber. The rapid changes in direction may take place in less than a microsecond through the electronic/logical control.

The radio frequency instrument 104 is connected to the probe antenna 105 in the anechoic chamber 150 by, for example, a data connection. The radio frequency instrument 104 may provide radio frequency signals to the probe antenna 105, and may read radio frequency signals from the probe antenna 105. The antenna unit controller 106 is configured to connect with devices 200 with advanced antenna 201 that are placed for testing in the anechoic chamber 150. The antenna unit controller 106 may provide both a power connection and a data connection to each device 200 placed in the anechoic chamber 150 for testing. In some embodiments, the antenna unit controller 106 may also have radio frequency (RF) or intermediate frequency (IF) inputs and outputs for AUTs with low integration levels. The input may also be optical or infrared, for example. In the embodiments described herein, devices 200 are communications devices with advanced antennas 201 that are dynamically reconfigurable, such as is envisioned in various proposals in 5G. The system for advanced array performance of FIG. 1 provides an environment for testing the advanced antennas 201 by dynamically reconfiguring and testing the advanced antennas 201 in the controlled environment of the anechoic chamber 150 in an automated process.

The test controller 101 sequences the testing process, communicates with the antenna unit controller 106 and the radio frequency instrument 104 during the testing, and collects measurement data from the radio frequency instrument 104 and the antenna unit controller 106. The test controller 101 may run, for example, a predetermined algorithm to test the advanced antenna 201. The predetermined algorithm may systematically control the radio frequency instrument 104 and the antenna unit controller 106 to alternate controls so that the advanced antenna 201 emits and then reads, or reads and then emits, signals to and from the probe antenna 105. An individual sequence of read and emit, or emit and then read, may be instructed for each different configuration (and reconfiguration) of the advanced antenna 201. The predetermined algorithm run by the test controller 101 may specify each different configuration of the advanced antenna 201, and then follow the instructions for each different configuration with a read/emit or emit/read sequence to test the configuration of the advanced antenna 201.

The classifier 102 classifies test results returned from testing of the advanced antenna 201, and the test executive 103 analyzes the classifications and determines whether the advanced antenna 201 passes, fails, or needs to be retested. The testing itself is controlled and/or coordinated by the test controller 101, which controls the radio frequency instrument 104 and the antenna unit controller 106 at least for the purposes of the testing, as discussed above.

The classifier 102 can process measurements of the various beam positions/configurations received from the test controller 101, and produce a quality assessment value (QAV) to be returned to the test executive 103 via the test controller 101. The measurements can include power measurements, and can be used to produce secondary measurements such as modulation quality (difference between measured signal and an ideal reference), levels of out of channel emissions, spectral emission mask (out of channel emissions to in channel emissions), and so on. Quality assessment values may be ratings, such as on a scale of 1-10 or 1-100 in percentile terms, and may be assigned to the advanced antenna 201 under test in regard to each measurement, each group of measurements, the measurements as a single group, and any secondary measurements based on division of, addition to, or subtraction from measurements. The quality assessment value indicates the projected overall quality of the advanced antenna 201 (and/or the device 200 containing the advanced antenna 201), even for characteristics that are not specifically measured during testing under control of the test controller 101 (such as characteristics that would be obtained based on far field scanning) based on the quality of the results of the characteristics that are measured using the system for advanced array performance testing in FIG. 1. Parameters to be used in calculating the QAV can be selected by the manufacturer/customer that orders the testing described herein, such that a manufacturer/customer may select fewer than the set of potential measurements and secondary measurements available in the testing.

Figure 2A:
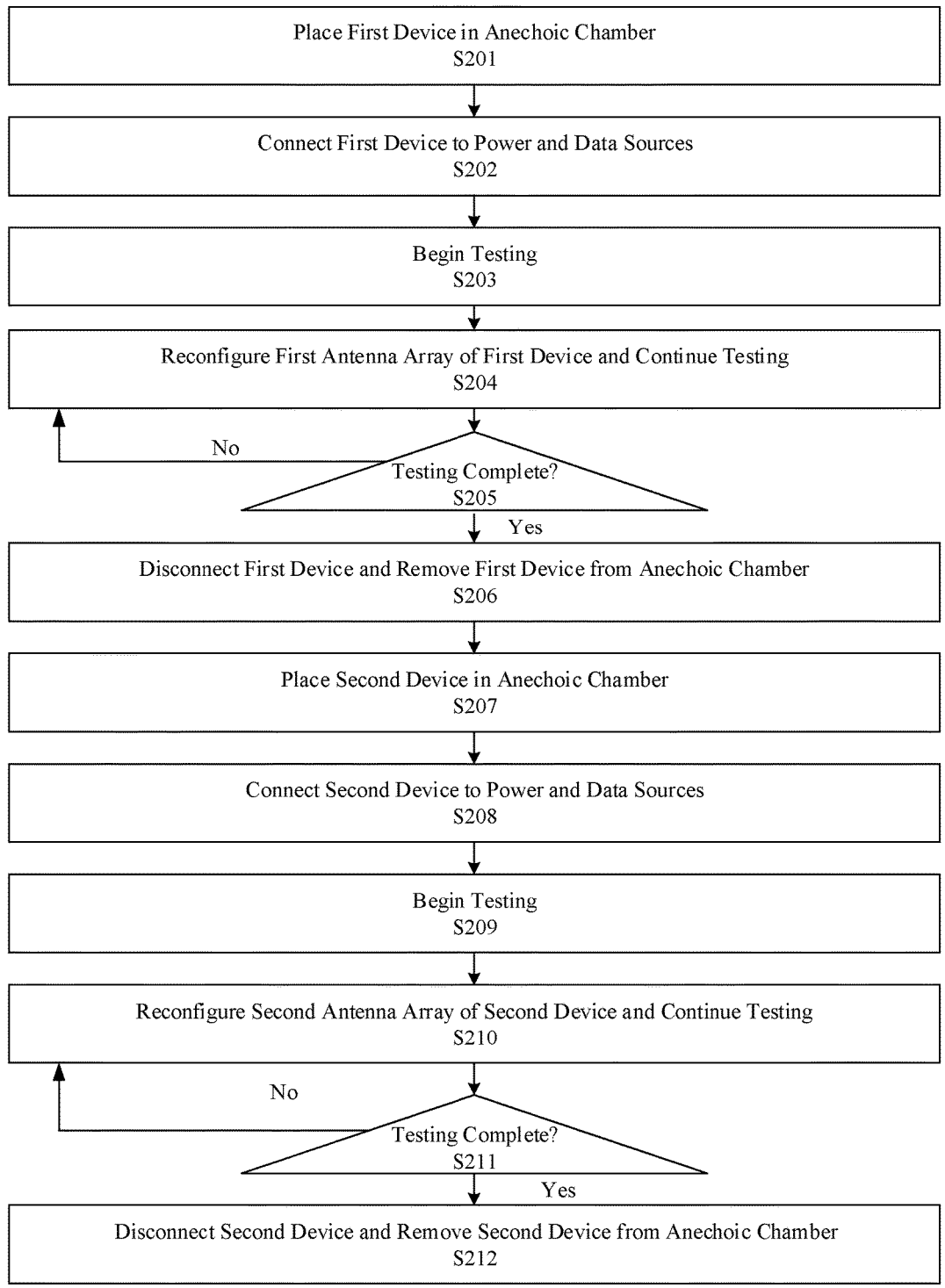
FIG. 2A illustrates a flow diagram that represents an overview of operations for advanced array performance testing in accordance with a representative embodiment.
Figure 2B:
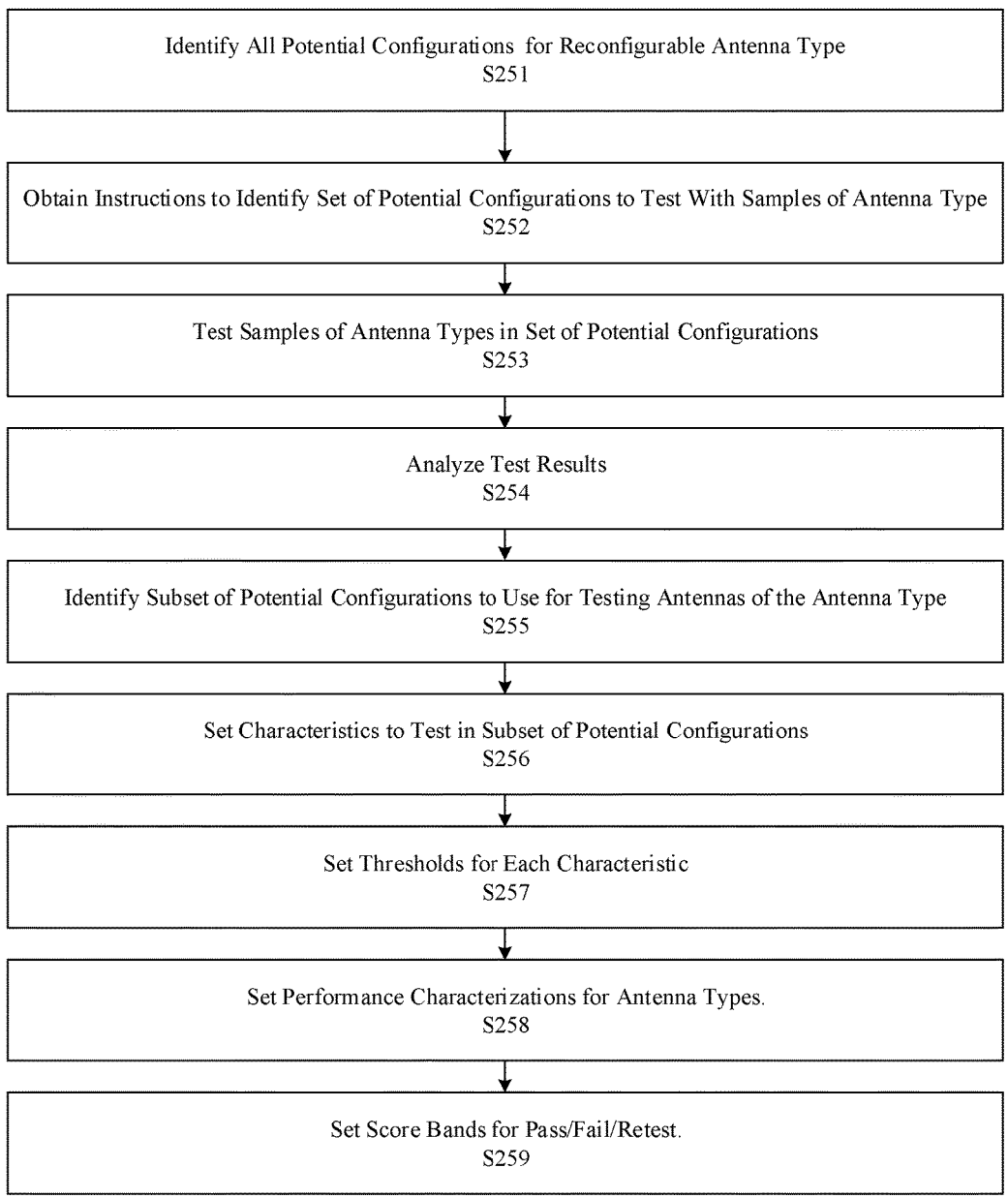
FIG. 2B illustrates a flow diagram that represents a preliminary process performed before the operations for advanced array performance testing in FIG. 2A.

For example, pre-testing of prototypes described with respect to FIG. 2B can be used to establish ratings from 1 to 100 for each measurement, and then in testing of advanced antennas 201 as in FIG. 2A, the QAVs for each measurement can be determined based on the QAVs determined from pre-testing the prototypes. The pool of individual measurements used to establish percentiles, for example, can be updated with additional individual measurements as testing of advanced antennas 201 takes place during production of devices 200. The classifier 102 can be implemented using software algorithms executed by a processor. In one embodiment, the classifier 102 compares the power measurements to predetermined thresholds set for each beam position/configuration. If all the values are individually and/or collectively within acceptable limits, the advanced antenna 201 can be found to "pass" by the test executive 103. In another embodiment, a "quality" metric is computed by the classifier 102 as a weighted sum of all the values which are within limits, so that most or all individual values cannot alone cause an advanced antenna 201 to fail in the analysis by the test executive 103. To establish the appropriate limits, a customer such as a manufacturer of antenna products may provide training (sample) antenna products with an advanced antenna 201 to test. The customer can characterize its expectations as to quality levels, and provide an expectation of a quality assessment value. The training (sample) antenna products can be tested using the configuration of FIG. 1, using configurations of beam positions provided by the customer as a list. The resulting power measurements can be recorded, and used to set the appropriate limits chosen for each beam position based on the statistics of the measured data and quality assessment value of the training set.

In yet another embodiment, the classifier 102 may include software used to implement a trained artificial intelligence based machine learning neural network (MLNN). A MLNN can be used to process power or other measurements and determine a quality assessment value. Construction of a MLNN as the basis of a classifier 102 may require a set of training data which can be compiled using the same method as used to establish limits, for example. Other measurements that may be processed include, for example, modulation quality and adjacent channel leakage ratio (ACLR) characteristics.

That is, in FIG. 1, an electronic steering ability of an advanced antenna 201 is used to quickly change configurations under control of the test controller 101 via the antenna unit controller 106. The testing can be implemented with "mid field" scanning, which reduces the size and cost of the anechoic chamber compared to conventional alternatives that require "far field" scanning. Mid-field scanning as described herein may require about 1-2 feet of testing space, for example, as distinguished from far-field scanning that requires tens, dozens or even hundreds of feet of testing space. The probe antenna 105 may be a "sparse" array of fixed probe antennas. Indeed, the entire testing process may be "fixed" in the sense that devices 200 can be individually placed into the anechoic chamber1 150 and each subjected to a rigorous dynamic sequence of tests that involve reconfiguring the advanced antenna 201 in predetermined ways and then sending and receiving test signals between the advanced antenna 201 and the probe antenna 105.

Although the classifier 102 and test executive 103 are shown as back-end add-ons to the test controller 101, the classifier 102 and test executive 103 may be implemented as cloud computing resources, for example, without departing from the scope of the present teachings. In this regard, testing of the advanced antenna 201 may involve taking thousands of measurements for each different configuration of the advanced antenna 201. Furthermore, the advanced antenna 201 may be reconfigured dozens, hundreds or even thousands of times all while remaining enclosed in the anechoic chamber 150 under the control of the test controller 101 via the antenna unit controller 106, that is, without requiring physical movement, interaction or reconfiguration. As described herein, the manufacturer/customer can select a subset of the pre-tested configurations to test the advanced antenna 201 following manufacture, and using the testing processes described herein obtain a QAV according to the manufacturer/customer's own criteria. The advanced antenna 201 can then be thoroughly tested using the mid field scanning in the anechoic chamber 150, without being subjected to far field scanning, and still be assessed for quality that reflects projected performance that would be achieved in far field scanning.

FIG. 2A illustrates a flow diagram that represents an overview of operations for advanced array performance testing in accordance with a representative embodiment.

At S201, a first device 200a (first DUT) is placed in the anechoic chamber 150. At S202, the first device 200a is connected to power and data sources. At S203, testing is begun. At S204, a first advanced antenna 201a of the first device 200a is electronically/logically reconfigured and testing is continued. At S205, a check is made as to whether testing is complete. If testing is not complete (S205=No), the process returns to S204 and the first advanced antenna 201a of the first device 200a is reconfigured again and testing is continued. The process repeats in a loop between S204 and S205 until testing is complete (S205=Yes). When testing on the first device 200a is complete, the first device 200a is disconnected and removed from the anechoic chamber 150 at S206.

At S207, a second device 200b is placed in the anechoic chamber 150. At S208, the second device 200b is connected to power and data sources. At S209, testing is again begun. At S210, a second advanced antenna 201b of the second device 200b is reconfigured and testing is continued. At S211, a check is made as to whether testing is complete. If testing is not complete (S211=No), the process returns to S210 and the second advanced antenna 201b of the second device 200b is electronically/logically reconfigured again and testing is continued. The process repeats in a loop between S210 and S211 until testing is complete (S211=Yes). When testing on the second device 200b is complete, the second device 200b is disconnected and removed from the anechoic chamber 150 at S212.

The testing in FIG. 2A does not require physical movement of the advanced antenna 201 in the anechoic chamber 150. This allows a size of the anechoic chamber 150 to be reduced compared to conventional anechoic chambers used for testing antennas, in that the conventional anechoic chambers required space to allow physical manipulation of antenna products being tested. During a test, the advanced antenna 201 is sequenced through a series of known beam positions, as many as hundreds or even a thousand or more. The reconfiguration and testing at each position can be performed very rapidly as the electronic/logical beam steering typically can be done electronically and/or logically in less than a microsecond. For each beam position, a power measurement is performed, so that the advanced antenna 201 is controlled to emit (or receive), then steered, then emit (or receive), then steered again, and so on. The radio frequency instrument 104 or antenna unit controller 106 collect the power measurement results and send the results to the test controller 101, either individually or in batches such as when all testing for the advanced antenna 201 is completed. While the example of FIG. 2A specifies power measurements, alternative and/or additional measurements such as modulation quality and adjacent channel leakage ratio (ACLR) characteristics may also be obtained.

Software in the test controller 101, radio frequency instrument 104 and antenna unit controller 106 can be used to collect power (or other) measurements for each beam position based on the recorded signal. The collected measurement data is then sent to the test controller 101.

Figure 11:
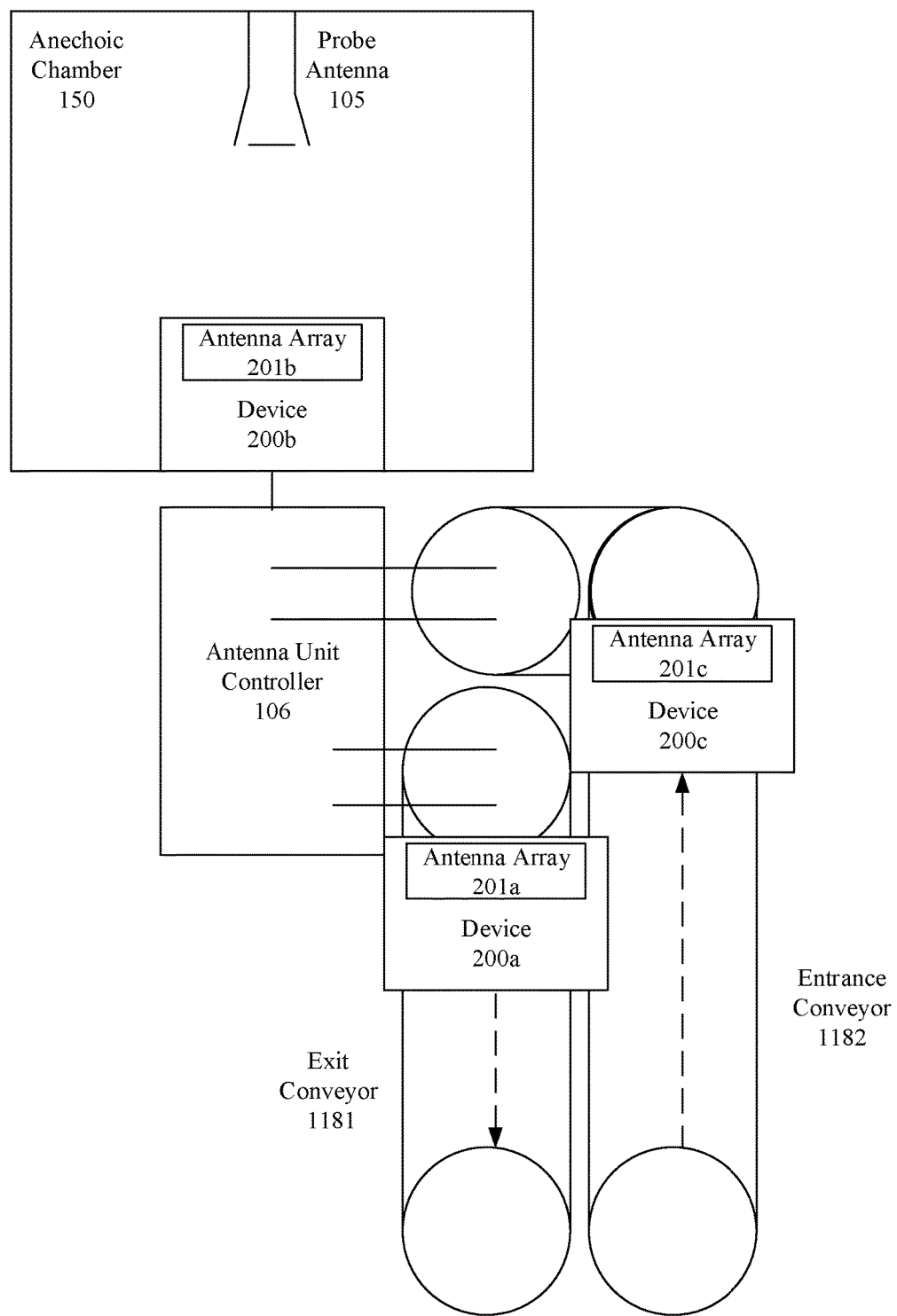
FIG. 11 illustrates a system for an antenna unit controller to automatically move devices in and out of an anechoic chamber in accordance with a representative embodiment.

The process in FIG. 2A is an overview. Notably, the connections at S202 and S208 and disconnections at S206 and S212 may be performed automatically, such as when the device 200 has a port of one or more male or female connectors that can be readily aligned with corresponding prearranged female or male connectors in the anechoic chamber 150. The connections and disconnections may be automatically performed when the devices 200 are automatically moved into and out of the anechoic chamber 150. An example of an automated system for moving devices 200 on an entrance conveyor 1182 and an exit conveyor 1181 is shown in FIG. 11 and described later.

Moreover, in FIG. 2A instructions to begin testing at S203 and S209, to reconfigure advanced antennas and continue testing at S204 and S210, to determine whether testing is complete at S205 and S211, and to disconnect and remove devices 200 from the anechoic chamber 150 may originate from the test controller 101 in FIG. 1. In other words, the test controller 101 may synchronize testing sequences by the probe antenna 105 and advanced antenna 201, reconfigurations of the advanced antenna 201, and the beginning and ending of the testing for each device 200.

The testing in FIG. 2A can be implemented with mid field scanning without requiring any "far field" scanning or testing. The requirements for mid field scanning may be measured using the distance between a probe antenna 105 and any of the devices 200 when in the anechoic chamber 150, and may be on the order of 18 inches depending on frequency and antenna configuration. Of course, the requirements for mid field scanning may be longer or shorter than 18 inches. That is, the over the air (OTA) component of the testing in FIG. 2A may be limited to a controlled environment in the anechoic chamber 150, and to a much smaller space requirement than the far field scanning required conventionally. The testing described herein may be limited to the results of such mid field scanning using the anechoic chamber 150, and the classifying of overall reliability may be much reduced in terms of space, time, effort and cost compared to using far field scanning, larger anechoic chambers, mechanical movement of antennas, and other features of conventional testing.

FIG. 2B illustrates a flow diagram that represents a preliminary process performed before the operations for advance array performance testing in FIG. 2A.

At S251, all potential configurations for a reconfigurable antenna type are identified. The reconfigurable antenna type may be a new type of antenna product planned by a manufacturer. The potential configurations may be all possible potential configurations in a specific testing environment, such as an anechoic chamber 150 and probe antenna 105 that are already used for testing. Details of configurations that may vary for each configuration may be an offset elevation angle from a default of zero (0) degrees, an offset azimuth angle from a default of zero (0) degrees, a power setting, which antenna elements (for a single advanced antenna) or which antennas (for an antenna array) are turned off, and so on. Theoretically, beam elevations and azimuths for an antenna or advanced antenna 201 should each be variable by up to 180 degrees in a controlled testing environment such as an anechoic chamber 150 when attached to, for example, a wall or floor. Additionally, power settings may vary from, for example, one (1) to twenty (20), or one (1) to one hundred (100), representing evenly distributed variations between a minimum and maximum power supply to the antenna product being tested.

At S252, a set of potential configurations is identified for testing. The set of potential configurations may be a subset of the pretested configurations selected by the manufacturer, and set in accordance with the manufacturer's specific requirements for the planned antenna product. In other words, the sets of potential configurations actually used to sample testing may be varied for different antenna products, types, manufacturers. For example, a manufacturer may limit the beam elevation angles to between 15 and 30 degrees of positive elevation, between negative (−) five and positive (+) degrees of azimuth, and five specific configurations of settings for on/off antenna elements (in an advanced antenna) or antennas (in an antenna array) and power supplies for each antenna element or antenna. In an embodiment, the manufacturer may specify a set of particular beamforms to be used for testing the advanced antenna 201, and the beamforms may each correspond to a different elevation, azimuth, on/off state of each antenna element or antenna, and power supply to each antenna element or antenna that is on.

At S253, samples of the planned antenna product are tested in each set of potential configurations identified and/or obtained at S252. In this way, a manufacturer may provide one, two, five or any number of sample antenna products to be tested. The sample antenna products may be tested as a form of pre-testing, in order to identify which characteristics to test and how to determine what might be considered passing or failing in a test. Additionally, the sample antenna products may be tested in order to identify a subset of the set of configurations to use in the testing. The pre-testing may also be performed to determine thresholds for each characteristic to use in marking pass or fail for each tested manufactured antenna product. The characteristics and thresholds can then be used to set an algorithm for generating a score from different measured characteristics so that manufactured antenna products to compare the manufactured antenna products against one another.

At S254, the test results from the pre-testing at S253 are analyzed. From the analysis at S254, a manufacturer can identify any potential configurations or characteristics used in the pre-testing that should not be used in actual testing.

At S255, a subset of potential configurations is identified. The subset of potential configurations includes the configurations that will be used for actual testing of antennas of the antenna type of the planned antenna product. For example, the actual testing will involve testing manufactured antenna products as they are completed on an assembly line and before they leave the manufacturing facility. In this way, antenna products that do not pass tests will not be shipped for sale, and antenna products that need to be retested can be returned to the testing area for retesting. The subset of potential configurations may be used in the actual testing for each antenna product that is completed on an assembly line. For example, the subset of potential configurations may be implemented using a software program that sets the configuration angles and power characteristics, so that every tested antenna product of a particular type for a particular manufacturer is tested in the same way with the same subset of configurations and power characteristics.

At S256, the actual characteristics to test in the subset of potential configurations are set. For example, the characteristics to test may require power to be received at each element of a probe antenna 105. A particular beamform from an advanced antenna 201 may be expected to result in particular received measurements at different elements of a probe antenna 105. At S257, thresholds for each characteristic may be set, and the threshold may be based on the expectations for power measurements at S256. For example, a threshold may be 95% of expected power, so that if less than 95% of the expected power at a particular antenna element in a wireless signal is detected for a particular configuration of an antenna product under test, the characteristic may be determined to not meet the threshold. In actual testing, each configuration may result in numerous measurements, such as 100 power measurements for 100 antenna elements (of an advanced antenna) or antennas (of an antenna array) in a probe antenna 105. Additionally, though the actual number of different configurations in any particular subset is not critical in this disclosure, a particular subset of configurations may include hundreds, thousands or even more than ten thousand configurations for every actual antenna product that is tested.

At S258, performance characterizations for antenna types are set. The performance characterizations may be characterizations of performance relative to the thresholds set at S257. For example, if the best theoretical performance is 100 and a threshold is set at 90, a performance of 93 or higher may be considered as a highest rating, a performance of 90 to 93 may be considered passing but not at the highest rating, and a performance from 85 to 90 may be considered failing but not noteworthy. A large deviation below a threshold however may be flagged during testing for follow, as any pattern of large and unexpected deviations may reflect that a product line or assembly process if flawed and requires investigation.

At S259, score bands for pass/fail/retest may be set. The score bands may be based on averages, percentages, deviations or other mechanisms for statistical analysis, and may involve grouping different characteristics set at S256 into groups and then running different types of statistical analysis on different groups. For example, an average measurement compared to thresholds may be aggregated for a subset of antenna elements or antennas of probe antenna 105, whereas a variance of measurements compared to thresholds may be analyzed for another subset of antenna elements or antennas of probe antenna 105. In this way, an actual score band set at S259 may be based on a simple average of measurements compared to thresholds, or may reflect a more complex analysis.

Figure 2C:
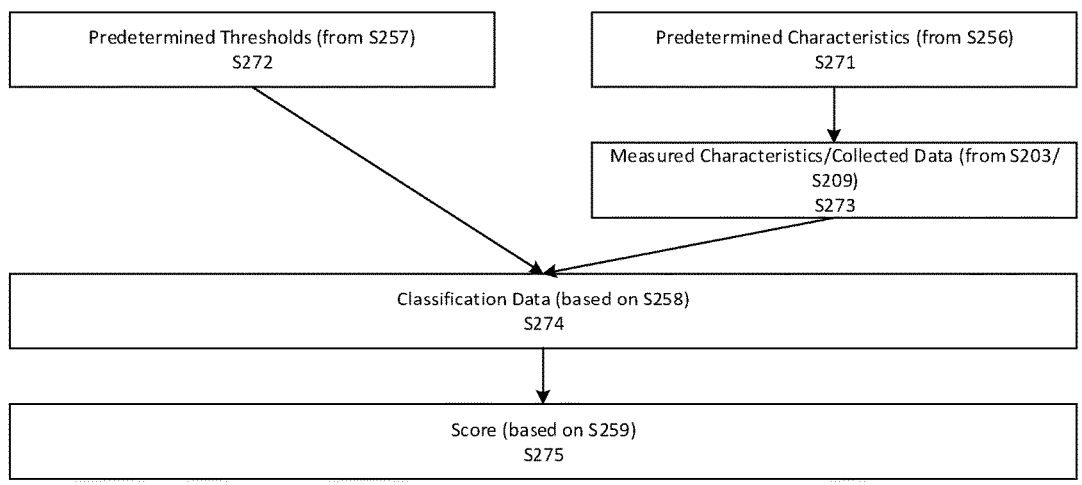
FIG. 2C illustrates a flow diagram that represents a flow of data types in the operations for advanced array performance testing in FIGS. 2A and 2B.

FIG. 2C illustrates a flow diagram that represents a flow of data types in the operations for advance array performance testing in FIGS. 2A and 2B.

At S271, predetermined characteristics are set for actual testing of an advanced antenna 201 following manufacturing and assembly. The predetermined characteristics are the characteristics determined at S256 in FIG. 2B. At S272, predetermined thresholds are set for each characteristic. The predetermined thresholds are the thresholds determined at S257 in FIG. 2B. At S273, characteristics are measured and collected as data. The characteristics are measured in the testing at S203 and S209 in FIG. 2A.

At S274, the measured characteristics are compared to the predetermined thresholds to produce classification data. The categories of classification data are produced in accordance with settings set at S258, where performance characterizations for the type of the advanced antenna under test are established. At S275, the actual classified data is used to calculate a score. Bands for providing a meaning to the score are set at S259, and the bands may define different results such as whether an advanced antenna 201 under test passes, fails or requires retesting.

Figure 3:
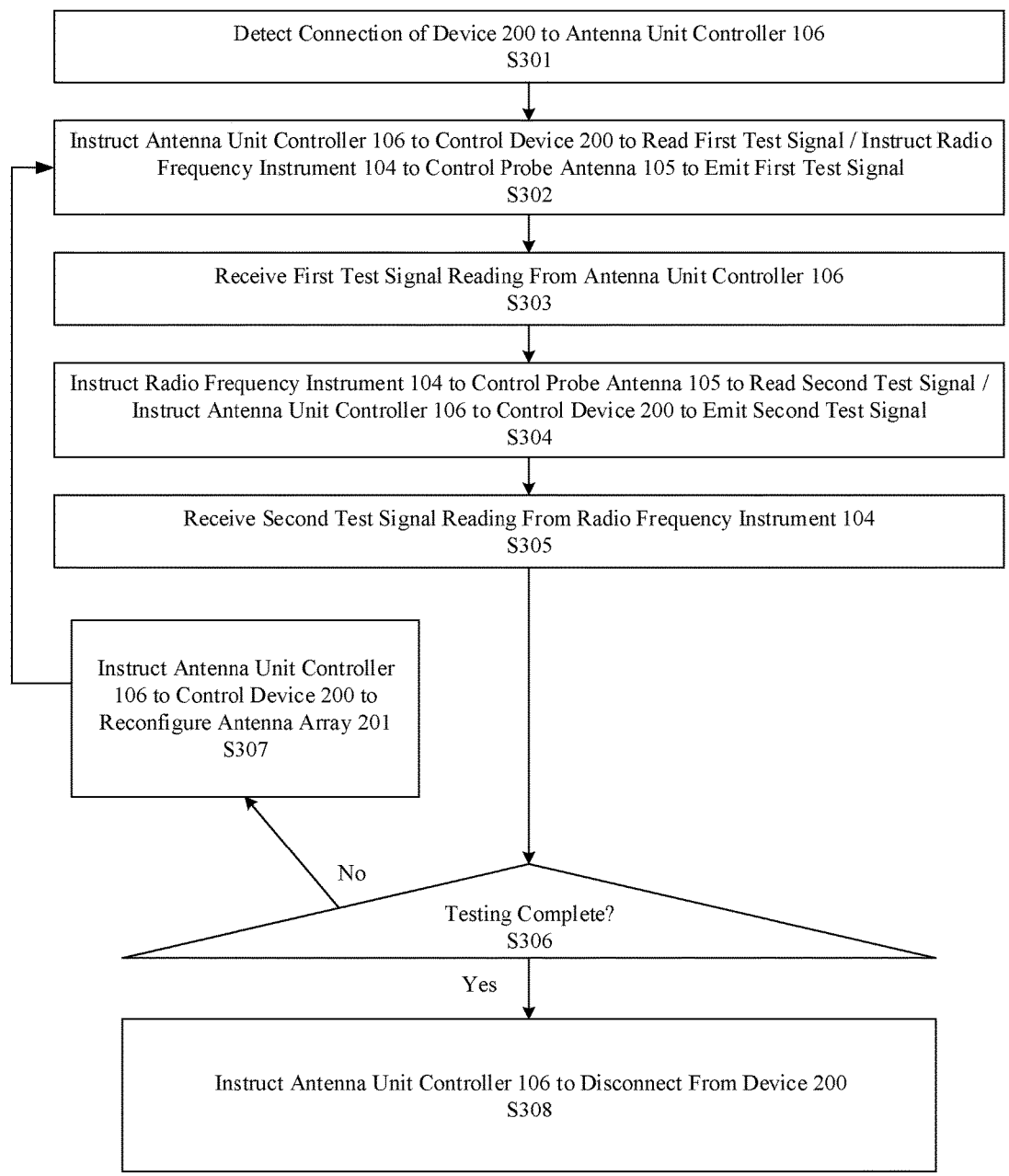
FIG. 3 illustrates a flow diagram that represents a process for a test controller in the system for advanced array performance testing in FIG. 1 in accordance with a representative embodiment.

FIG. 3 illustrates a flow diagram that represents a process for a test controller in the system for advance array performance testing in FIG. 1 in accordance with a representative embodiment.

At S302, connection of the device 200 to the antenna unit controller 106 is detected. As noted, the connection may be performed automatically such as when a port of the device 200 has one or more male or female connectors that can be readily aligned with corresponding prearranged female or male connectors in the anechoic chamber 150. Whether the connection is automated or not, the connection is detected by the test controller 101 at S301. Afterwards, the test controller 101 instructs the antenna unit controller 106 to control the device 200 to read a first test signal, while also instruction the radio frequency instrument 104 to control the probe antenna 105 to emit a first test signal S302. At S303, the test controller 101 receives the first test signal reading from the antenna unit controller 106. At S304, the test controller 101 instructs the radio frequency instrument 104 to control the probe antenna to read a second test signal, while instructing the antenna unit controller 106 to control the device 200 to emit a second test signal. At S305, the test controller receives the second test signal reading from the radio frequency instrument 104.

In other words, in the process from S302 to S305, the test controller 101 alternates control of transmission and reception between the probe antenna 105 and the advanced antenna 201 for a particular configuration of the advanced antenna 201. Of course, the order of the process described above is only an example, and may be reversed so that the advanced antenna 201 emits first and then reads. Additionally, additional steps may be performed such as by either the probe antenna 105 or the advanced antenna 201 performing multiple consecutive emissions.

At S306, the test controller 101 determines whether testing is complete, such as by determining whether the current configuration of the advanced antenna 201 is the last one in a testing sequence. If testing is not complete (S306=No), at S307 the test controller 101 instructions the antenna unit controller 106 to control the device 200 to reconfigure the advanced antenna 201. Afterwards, the process returns to S302 for the alternating sequence of emissions and readings from S302 to S305. If testing is complete (S306=Yes), at S308 the test controller 101 instructs the antenna unit controller 106 to disconnect from the device 200.

Figure 4:
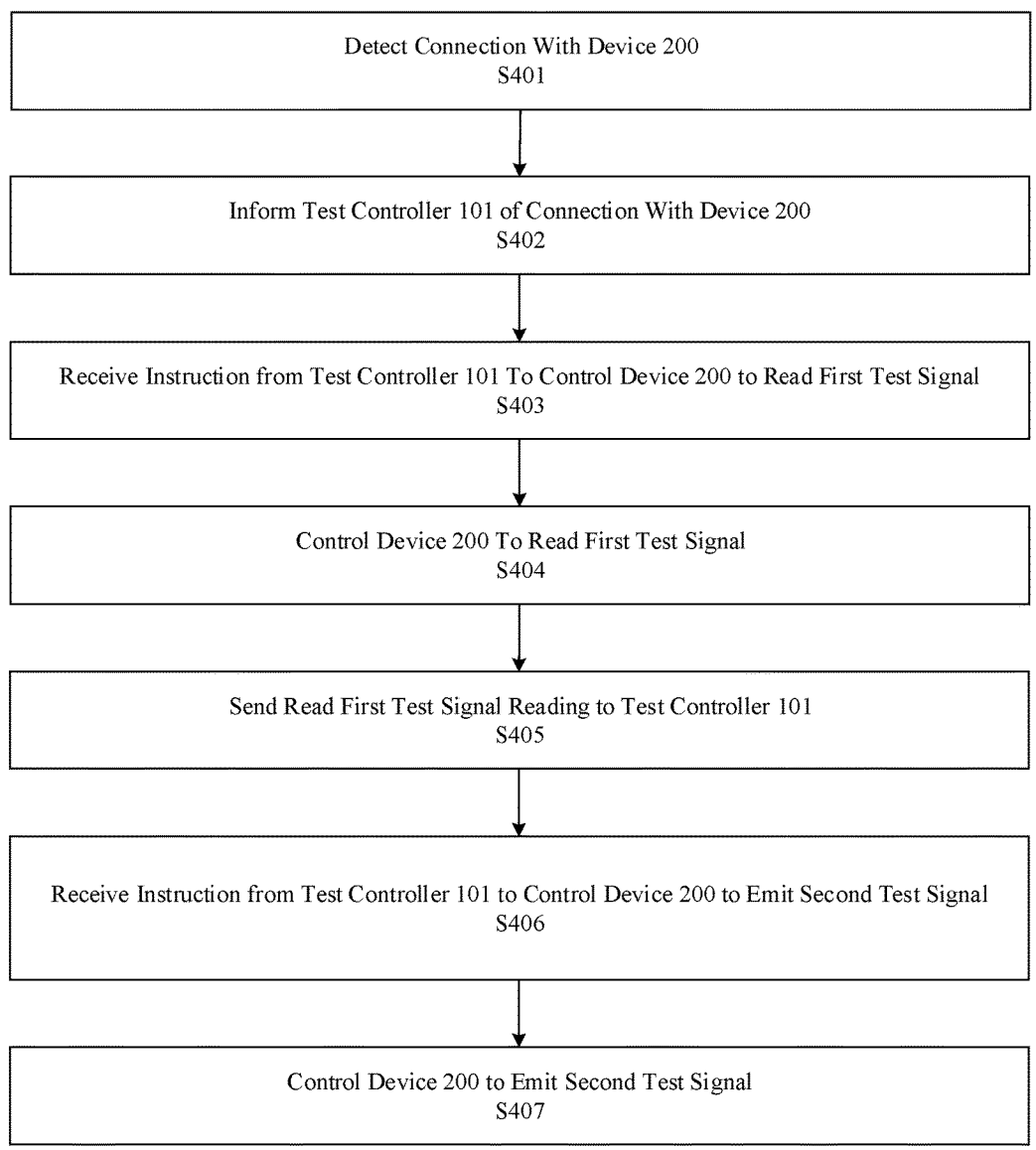
FIG. 4 illustrates a flow diagram that represents a process for an antenna unit controller in the system for advanced array performance testing in FIG. 1 in accordance with a representative embodiment.

FIG. 4 illustrates a flow diagram that represents a process for an antenna unit controller in the system for advanced array performance testing in FIG. 1 in accordance with a representative embodiment.

At S401, the antenna unit controller 106 detects a connection with device 200. At S402, the antenna unit controller 106 informs the test controller 101 of the connection with the device 200. At S403, the antenna unit controller 106 receives instructions from the test controller 101 to control the device 200 to read a first test signal. At S404, the antenna unit controller 106 controls the device 200 to read the first test signal. At S405, the antenna unit controller 106 sends the read first test signal reading to the test controller 101. At S406, the antenna unit controller 106 receives an instruction from the test controller 101 to control the device 200 to emit a second test signal. At S407, the antenna unit controller 106 controls the device 200 to emit the second test signal.

The antenna unit controller 106 is expected to behave as a server in a configuration with the test controller 101. That is, the antenna unit controller 106 is expected to operate as a server responding to commands from a test controller 101.

Figure 5:
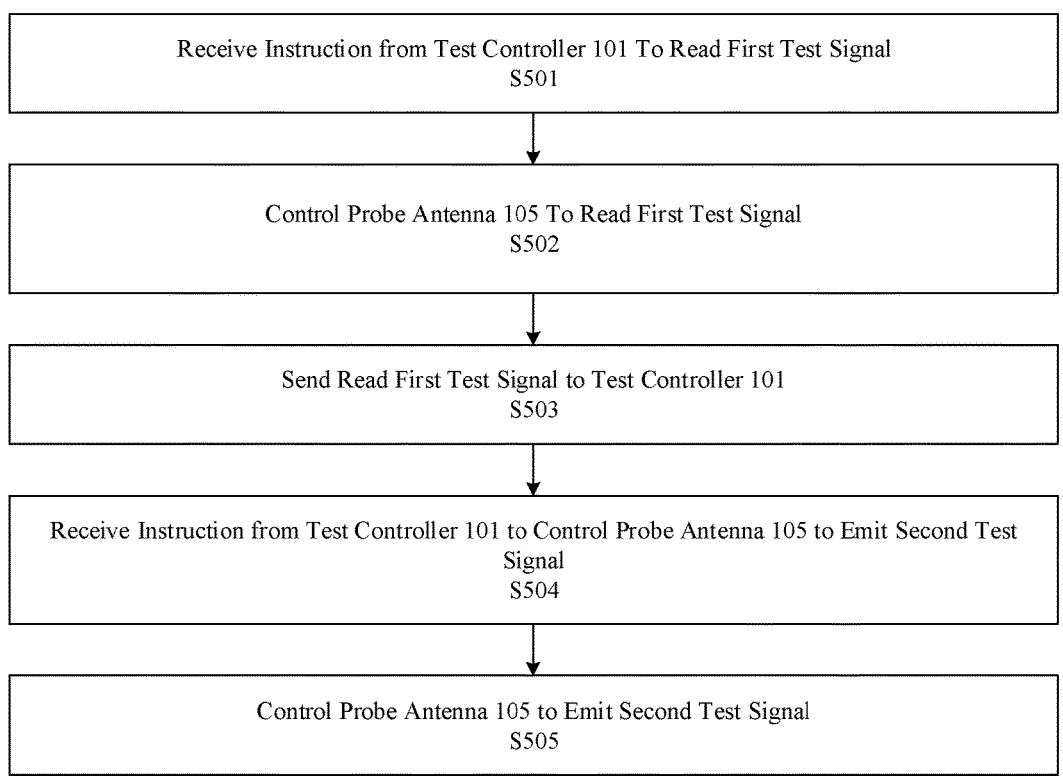
FIG. 5 illustrates a flow diagram that represents a process for a radio frequency instrument in the system for advanced array performance testing in FIG. 1 in accordance with a representative embodiment.

FIG. 5 illustrates a flow diagram that represents a process for a radio frequency instrument in the system for advance array performance testing in FIG. 1 in accordance with a representative embodiment.

At S501, the radio frequency instrument 104 receives instructions from the test controller 101 to control the probe antenna 105 to read a first test signal. At S502, the radio frequency instrument 104 controls the probe antenna 105 to read the first test signal. At S503, the radio frequency instrument 104 sends the read first test signal reading to the test controller 101. At S504, the radio frequency instrument 104 receives an instruction from the test controller 101 to control the probe antenna 105 to emit a second test signal. At S505, the radio frequency instrument 104 controls the probe antenna 105 to emit the second test signal.

The radio frequency instrument 104 is expected to behave as a server in a configuration with the test controller 101. That is, the radio frequency instrument is expected to operate as a server under the test controller 101.

Figure 6:
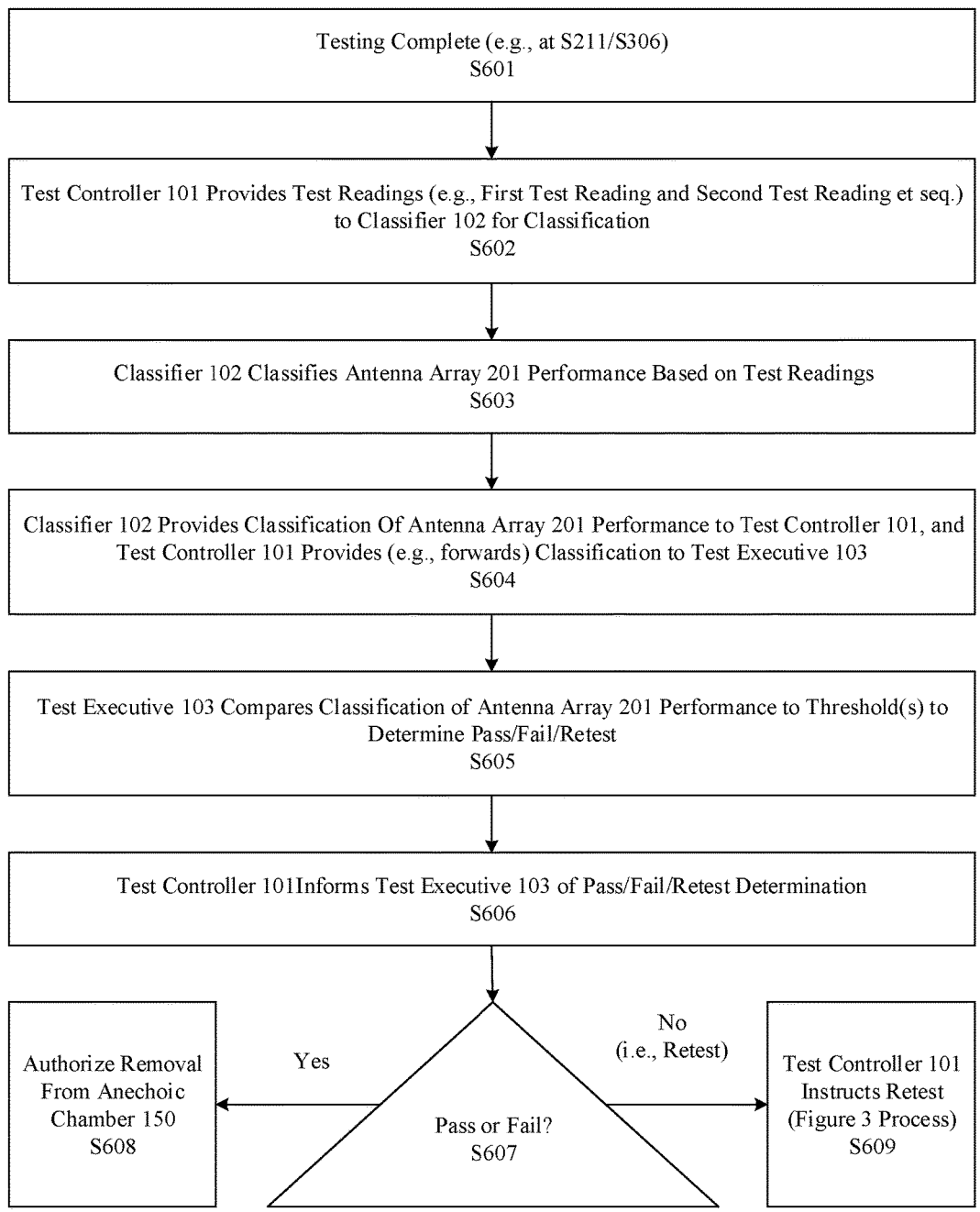
FIG. 6 illustrates a flow diagram that represents a process for a test controller, classifier, and test executive in the system for advanced array performance testing in FIG. 1 in accordance with a representative embodiment

FIG. 6 illustrates a flow diagram that represents a process for a test controller, classifier, and test executive in the system for advanced array performance testing in FIG. 1 in accordance with a representative embodiment.

At S601, testing is completed, such as at S211 in FIG. 2A or S306 in FIG. 3. At S602, the test controller 101 provides test readings to the classifier 102 for classification. The test readings may be, for example, first test readings and second test readings described for embodiments above.

At S603, the classifier 102 classifies the advanced antenna 201 performance based on the test readings. As noted previously, the test readings may include thousands of data points for numerous different characteristics of the advanced antenna 201. Accordingly, the classification at S603 may be significantly more complex than a binary determination of pass or fail.

At S604, the classifier 102 provides the classification(s) of the advanced antenna 201 performance to the test controller 101, and the test controller provides the classification(s) to the test executive 103. The test controller 101 may provide the classification(s) to the test executive 103 by, for example, forwarding the classification(s). The classification(s) can be numerical scores, such as percentiles compared to previous test results, for each measurement. Additionally, the classifications can involve a form of filtering, such as calculating a weighted overall quality assessment value (QAV) based only on measurements that met pre-established thresholds.

At S605, the test executive 103 compares the classification of the advanced antenna 201 performance to a predetermined threshold or thresholds, to determine whether the advanced antenna 201 passes, fails, or must be retested. At S606, the test controller 101 informs the test executive 103 of the pass/fail/retest determination. At S607, the test controller 101 determines whether the advanced antenna 201 passes or fails. Whether the advanced antenna 201 passes or fails (S607=Yes), the device 200 in the anechoic chamber 150 can be removed from the anechoic chamber 150 since the testing is complete. Thus, the test controller 101 authorizes removal of the device 200 in the anechoic chamber 150 from the anechoic chamber 150 at S608. However, if the advanced antenna 201 neither passes nor fails (S607=No), the device 200 in the anechoic chamber 150 must be retested. Thus, if the advanced antenna 201 does not pass or fail, the test controller 101 provides instructions to the antenna unit controller 106 to reconnect the device 200 in the anechoic chamber 150 (if already disconnected) and restart the process of FIG. 3 at S609.

Figure 7:
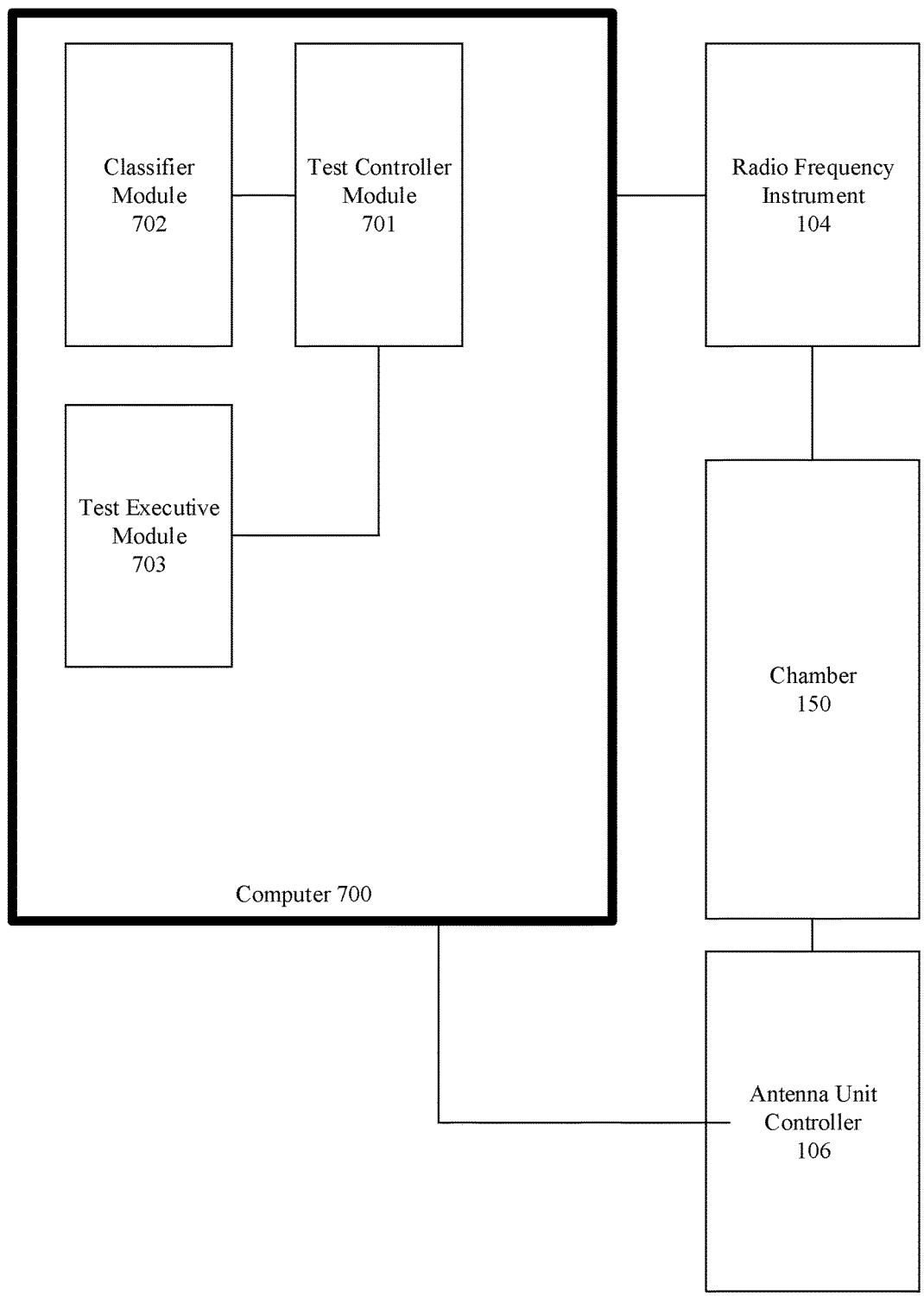
FIG. 7 is a schematic block diagram illustrating another system for advanced array performance testing in accordance with a representative embodiment.

FIG. 7 is a schematic block diagram illustrating another system for advance array performance testing in accordance with a representative embodiment.

In FIG. 7, the system for advanced array performance testing includes a test controller module 701, a classifier module 702, and a test executive module 703. The system for advanced array performance testing also includes the radio frequency instrument 104 of FIG. 1, an antenna unit controller 106 of FIG. 1, an anechoic chamber 150 of FIG. 1, and a probe antenna 105 in the anechoic chamber 150 of FIG. 1.

In FIG. 7, the test controller module 701, classifier module 702, and test executive module 703 are all separable components of a computer 700. The test controller module 701, classifier module 702, and test executive module 703 may be implemented by different software programs stored at separate tangible memory locations/addresses, and executed by one or more different processor of the computer 700. In the embodiment of FIG. 7, the computer 700 may by itself perform any or all of the advance array performance testing processes described above with respect to a test controller 101, classifier 102, and test executive 103 for an advanced antenna 201 in an anechoic chamber 150.

Figure 8:
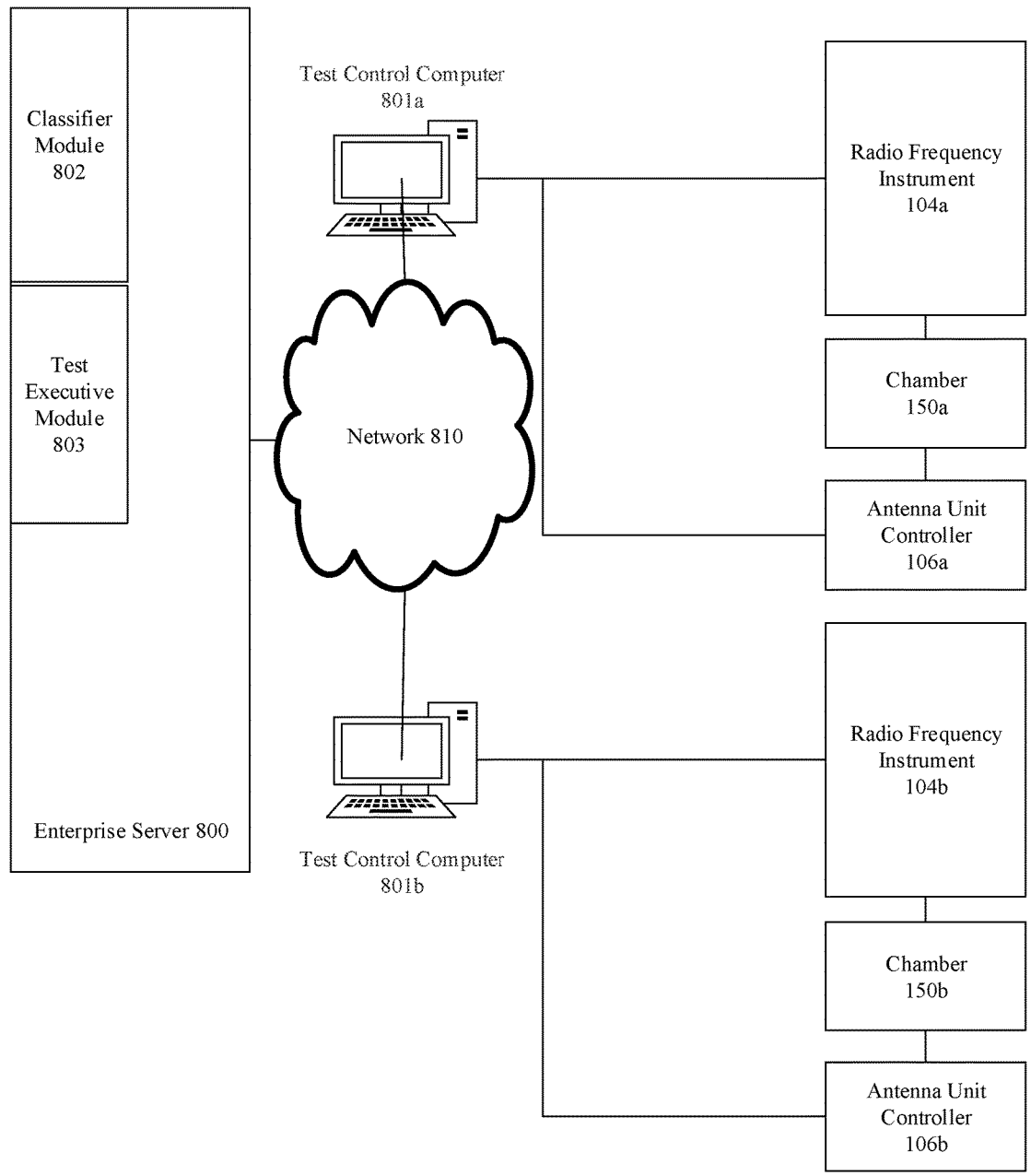
FIG. 8 is a schematic block diagram illustrating another system for advanced array performance testing in accordance with a representative embodiment.

FIG. 8 is a schematic block diagram illustrating another system for advance array performance testing in accordance with a representative embodiment.

In FIG. 8, different test control computers 801*a*, 801*b* control different radio frequency instruments 104*a*, 104*b* and different antenna unit controllers 106*a*, 106*b*. Additionally, the two different test control computers 801*a*, 801*b* are connected across network 810 to an enterprise server 800 that includes a classifier module 802 and a test executive module 803. Each different test control computer 801*a*, 801*b* may include any or all of the characteristics previously described with respect to the test controller 101 of FIG. 1 and/or the test controller module 701 of FIG. 7. Additionally, the classifier module 802 may include any or all of the characteristics previously described with respect to the classifier 102 of FIG. 1 and/or the classifier module 702 of FIG. 7. Moreover, the test executive module 803 may include any or all of the characteristics previously described with respect to the test executive 103 of FIG. 1 and/or the test executive module 703 of FIG. 7. FIG. 8 also illustrates chambers 150a and 150b for context.

Figure 10:
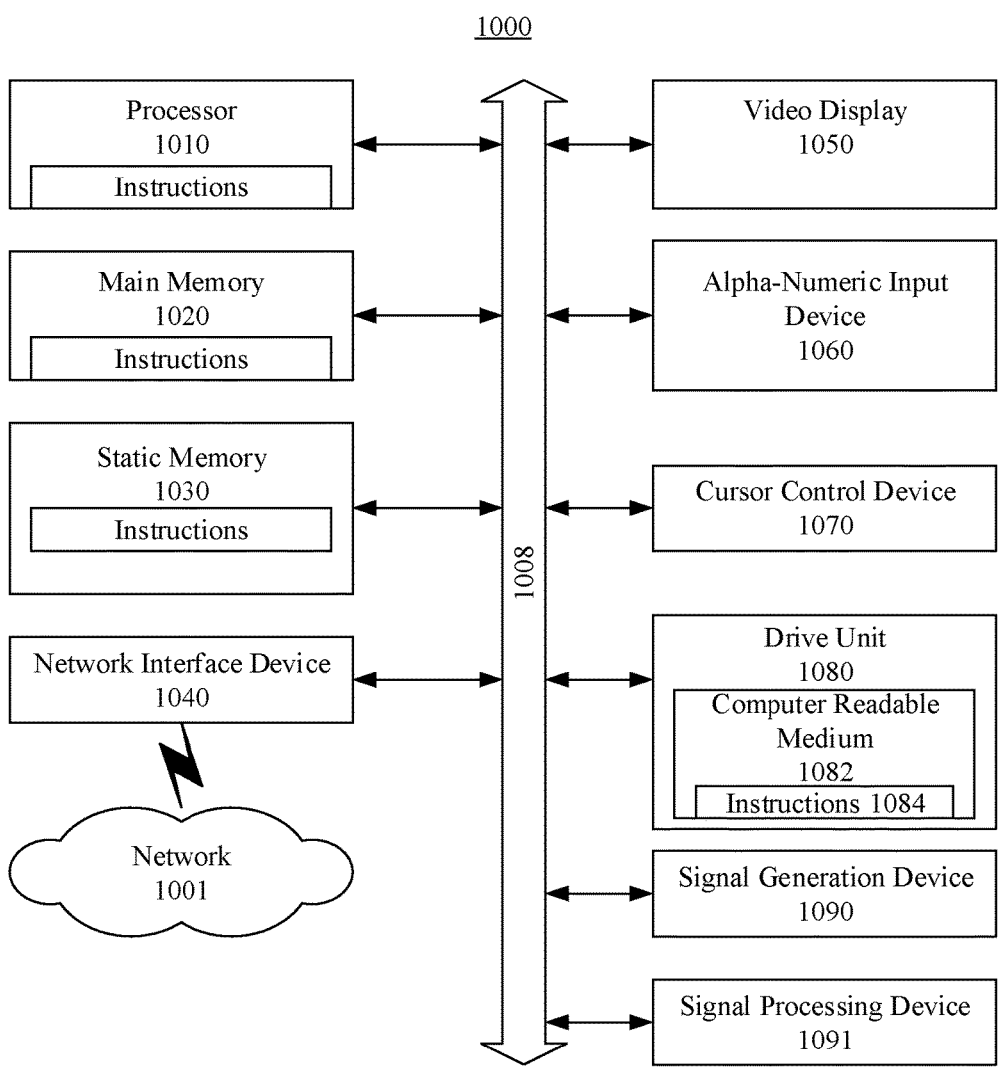
FIG. 10 illustrates an exemplary general computer system that includes a set of instructions for advanced array performance testing in accordance with a representative embodiment.

In FIG. 8, an enterprise server 800 includes the test executive module 803 and the classifier module 802. For example, the enterprise server 800 may perform back-end classification of advanced antenna 201 testing performance for multiple different test control computers 801a, 801b that each perform the tests for tens, hundreds, or even thousands of advanced antennas 201. The enterprise server 800 may also perform the test executive pass/fail/retest determinations for multiple different test control computers 801a, 801b that each perform the tests for tens, hundreds, or even thousands of advanced antennas 201. In another embodiment, the enterprise server 800 may be replaced by or representative of distributed processing performed in the "cloud", such as by different generic data center processor and memory resources that are dynamically assigned on-demand, whether in real time or in scheduled batches. In any event, the enterprise server 800 is representative of a tangible server computer with one or more processors and memory, such as is illustrated in FIG. 10 described below.

Figure 9:
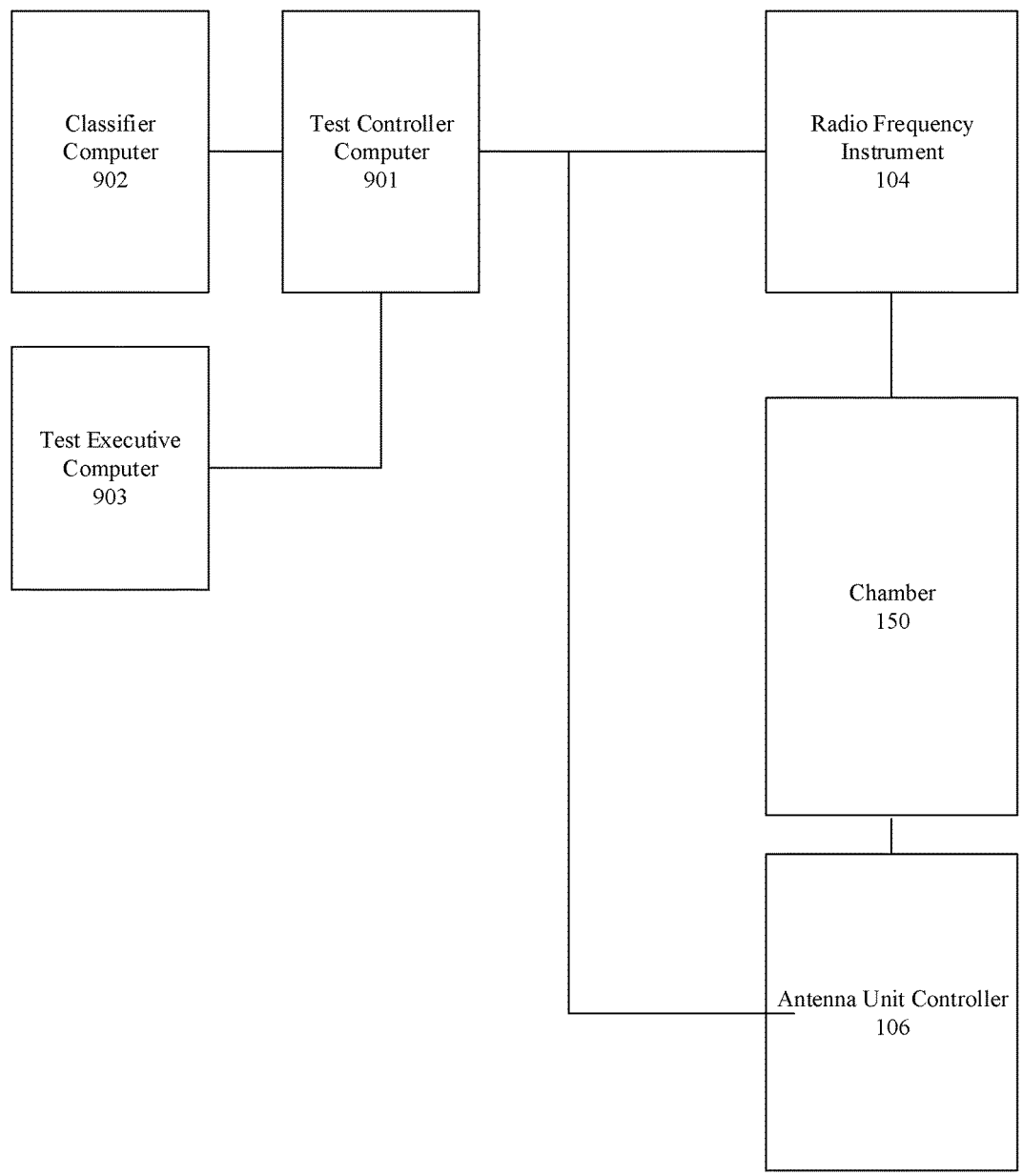
FIG. 9 is a schematic block diagram illustrating another system for advanced array performance testing in accordance with a representative embodiment.

FIG. 9 is a schematic block diagram illustrating another system for advance array performance testing in accordance with a representative embodiment.

In FIG. 9, a test controller computer 901 is a stand-alone computer that may provide any or all of the characteristics previously described with respect to the test controller 101 of FIG. 1 and/or the test controller module of FIG. 7. Additionally, the classifier computer 902 may include any or all of the characteristics previously described with respect to the classifier 102 of FIG. 1 and/or the classifier module 702 of FIG. 7. Moreover, the test executive computer 903 may include any or all of the characteristics previously described with respect to the test executive 103 of FIG. 1 and/or the test executive module 703 of FIG. 7. In other words, in FIG. 9 each of the test controller computer 901, the classifier computer 902, and the test executive computer 903 is a physically separate computer device, and each may even be provided in separate rooms or buildings. FIG. 9 also shows a chamber 150, which may be the actual anechoic test chamber in which testing is performed.

In FIG. 9, the test controller computer 901 controls the radio frequency instrument 104 and the antenna unit controller 106. The radio frequency instrument 104 and the antenna unit controller 106 operate in the same manner as described separately for other embodiments, and the descriptions thereof will not be repeated for the sake of brevity.

FIG. 10 illustrates an exemplary general computer system that includes a set of instructions for advance array performance testing in accordance with a representative embodiment. FIG. 10 represents a general computer system architecture of features that may be present in any computer system 1000 on which a method of advance array performance testing can be implemented. The computer system 1000 can include a set of instructions that can be executed to cause the computer system 1000 to perform any one or more of the methods or computer based functions disclosed herein. The computer system 1000 may operate as a stand-alone device or may be connected, for example, using a network 1001, to other computer systems or peripheral devices.

In a networked deployment, the computer system 1000 may operate in the capacity of a server or as a client user computer in a server-client user network environment, or as a peer computer system in a peer-to-peer (or distributed) network environment. The computer system 1000 can also be implemented as or incorporated into various devices, such as a stationary computer, a mobile computer, a personal computer (PC), a laptop computer, a tablet computer, a wireless smart phone, a test controller, a test executive, a classifier, a radio frequency instrument, an antenna unit controller, a computer, a classifier module, a test controller module, a test executive module, an enterprise server, a test control computer, or any other machine capable of executing a set of instructions (sequential or otherwise) that specify actions to be taken by that machine. The computer system 1000 can be incorporated as or in a particular device that in turn is in an integrated system that includes additional devices. In a particular embodiment, the computer system 1000 can be implemented using electronic devices that provide data communication. Further, while a single computer system 1000 is illustrated, the term "system" shall also be taken to include any collection of systems or sub-systems that individually or jointly execute a set, or multiple sets, of instructions to perform one or more computer functions.

As illustrated in FIG. 10, the computer system 1000 includes a processor 1010. A processor for a computer system 1000 is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor for a computer system 1000 is configured to execute software instructions in order to perform functions as described in the various embodiments herein. A processor for a computer system 1000 may be a general-purpose processor or may be part of an application specific integrated circuit (ASIC). A processor for a computer system 1000 may also be a microprocessor, a microcomputer, a processor chip, a controller, a microcontroller, a digital signal processor (DSP), a state machine, or a programmable logic device. A processor for a computer system 1000 may also be a logical circuit, including a programmable gate array (PGA) such as a field programmable gate array (FPGA), or another type of circuit that includes discrete gate and/or transistor logic. A processor for a computer system 1000 may be a central processing unit (CPU), a graphics processing unit (GPU), or both. Additionally, any processor described herein may include multiple processors, parallel processors, or both. Multiple processors may be included in, or coupled to, a single device or multiple devices. Moreover, a virtual machine (VM) that performs functions described herein may be supported by a processor or multiple processors.

Moreover, the computer system 1000 includes a main memory 1020 and a static memory 1030 that can communicate with each other via a bus 1008. Memories described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted.

As shown, the computer system 1000 may further include a video display unit 1050, such as a liquid crystal display (LCD), an organic light emitting diode (OLED), a flat panel display, a solid-state display, or a cathode ray tube (CRT). Additionally, the computer system 1000 may include an input device 1060, such as a keyboard/virtual keyboard or touch-sensitive input screen or speech input with speech recognition, and a cursor control device 1070, such as a mouse or touch-sensitive input screen or pad. The computer system 1000 can also include a disk drive unit 1080, a signal generation device 1090, such as a speaker or remote control, and a network interface device 1040. Also in FIG. 10, a computer system 1000 can further include a signal processing device 1091 as a counterpart to the signal generation device 1090. For example, the signal generation device 1090 can generate the IF/RF signals for testing the advanced antennas 201 via the network interface device 1040. The signal processing device 1091 can perform, for example, digitization of a signal or signals received from the advanced antennas 201 via the network interface device 1040.

In a particular embodiment, as depicted in FIG. 10, the disk drive unit 1080 may include a computer-readable medium 1082 in which one or more sets of instructions 1084, e.g. software, can be embedded. Sets of instructions 1084 can be read from the computer-readable medium 1082. Further, the instructions 1084, when executed by a processor, can be used to perform one or more of the methods and processes as described herein. In a particular embodiment, the instructions 1084 may reside completely, or at least partially, within the main memory 1020, the static memory 1030, and/or within the processor 1010 during execution by the computer system 1000.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionality as described herein, and a processor described herein may be used to support a virtual processing environment.

The present disclosure contemplates a computer-readable medium 1082 that includes instructions 1084 or receives and executes instructions 1084 responsive to a propagated signal; so that a device connected to a network 1001 can communicate voice, video or data over the network 10010. Further, the instructions 1084 may be transmitted or received over the network 1001 via the network interface device 1040.

FIG. 11 illustrates a system for an antenna unit controller to automatically move devices in and out of an anechoic chamber in accordance with a representative embodiment. In FIG. 11, an entrance conveyor 1182 carries first device 200a, second device 200b, and a third device 200c to an antenna unit controller 106, and an exit conveyor 1181 carries first device 200a, second device 200b, and third device 200c from the antenna unit controller 106. An automated arm (not shown), such as a robotic arm, or other mechanical element may carry the first device 200a, second device 200b, and third device 200c into and out of the anechoic chamber 150. As noted previously, first device 200a, second device 200b, and third device 200c may be positioned so as to be automatically connected to power and data sources in the anechoic chamber when initially positioned. This positioning and automatic connection may be performed and accomplished using, for example, conveyors and robotic lifting mechanisms such as arms.

As noted throughout this disclosure, the antenna unit controller 106 operates under the control of a test controller 101, a test controller module 701, or a test controller computer 801. The antenna unit controller 106 is therefore instructed when testing is deemed complete, and when to initiate testing. The antenna unit controller 106 also informs the test controller 101, the test controller module 701, or the test controller computer 801 when a first device 200a, second device 200b, and/or third device 200c is in the anechoic chamber 150 and connected, and therefore is ready for testing.

FIG. 12 illustrates a probe antenna or probe antenna array in an anechoic chamber in the system for advance array performance testing in FIG. 1 in accordance with a representative embodiment.

In FIG. 12, a probe antenna array 1205 includes multiple probe antennas 1205A, 1205B, 1205C, 1205D, 1205E. The multiple probe antennas 1205A, 1205B, 1205C, 1205D, 1205E are representative of the probe antennas 105 shown in various Figures for various embodiments herein. It should be understood that the probe antennas 105 are merely representative of one or more probe antennas 105, and there may be hundreds or even thousands of the probe antenna 105 in any probe antenna array 1205 provided in any of the anechoic chamber 150 herein under the control of the test controller 101, the test controller module 701, or the test controller computer 801. In other words, any probe antenna 105 shown in any Figure herein should be understood as a representative of a probe antenna 105 or a probe antenna array 1205 with five, tens, hundreds or even thousands of probe antennas that are identical to probe antenna 105.

Accordingly, high speed testing and characterization of advanced antenna performance enables quick change configurations of advanced antennas without physical movement by using electronic steering ability to speed up the testing. The present disclosure provides for a "mid field" scanning to reduce the size and costs of the anechoic chamber required. The difference in space requirements for over the air testing involving mid field scanning is substantial compared to far field scanning, and controlling the over the air environment to the anechoic chamber provides reliable testing with significantly less burden than using far field testing. As described above, the testing through classification may be limited to mid field testing, and the resulting measurements of overall reliability can be used even to dynamically determine when an advanced antenna 201 should be retested. The present disclosure describes implementation of a sparse array of fixed probe antennas to reduce equipment costs. Moreover, high speed testing and characterization of advanced antenna performance provides for an algorithm to classify the advanced antennas based on measured data and to enable use of cloud based computing resources to reduce costs of computing and increase manufacturing processing line speed.

Although high speed testing and characterization of advanced antenna performance has been described with reference to several exemplary embodiments, it is understood that the words that have been used are words of description and illustration, rather than words of limitation. Changes may be made within the purview of the appended claims, as presently stated and as amended, without departing from the scope and spirit of high speed testing and characterization of advanced antenna performance in its aspects. Although high speed testing and characterization of advanced antenna performance has been described with reference to particular means, materials and embodiments, high speed testing and characterization of advanced antenna performance is not intended to be limited to the particulars disclosed; rather high speed testing and characterization of advanced antenna performance extends to all functionally equivalent structures, methods, and uses such as are within the scope of the appended claims.

For example, although this disclosure begins by referencing multiple-in/multiple out (MIMO) configurations, the teachings herein are nor limited to MIMO configurations. Similarly, although this disclosure begins by referencing millimeter wave and 5G implementations, the teachings herein are not limited to millimeter wave and 5G implementations, and may be applicable to other portions of the frequency spectrum and for advanced antennas in 4G also. That is, the teachings described herein will be applicable to advanced antennas large or small, and that operate using millimeter wave and other ranges of the frequency spectrum, and under 5G as well as standards other than 5G.

Moreover, the test controlling, classifying, and pass/fail/retest determinations have been shown in various embodiments as being performed by the computer 700 by itself, different test control computers 801*a*, 801*b* and an enterprise server 800, or a configuration of the test control computer 901, classifier computer 902, and test executive computer 903. However, there are innumerable ways to distribute the processes described herein among various computers, servers and even cloud data centers. Therefore, it should be understood that where the processes are performed is variable, but the automated reconfiguration of advanced antennas 201 in an anechoic chamber 150 or other controlled environment while undergoing testing is present in every embodiment described herein.

Although the present specification describes components and functions that may be implemented in particular embodiments with reference to particular standards and protocols, the disclosure is not limited to such standards and protocols. For example, standards such as the upcoming 5G standard(s) represent examples of the state of the art. Such standards are periodically superseded by more efficient equivalents having essentially the same functions. Accordingly, replacement standards and protocols having the same or similar functions are considered equivalents thereof. As should be clear from the various descriptions provided herein, the advance array performance testing is applicable to testing communications devices with an advanced antenna 201 systematically using a controlled environment and systematic processing of transmission/reception patterns as the advanced antenna 201 is dynamically reconfigured.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In accordance with an aspect of the present disclosure, a system for testing a reconfigurable antenna under test in an anechoic chamber includes an antenna unit controller, a radio frequency instrument, a test controller, and a classifier. The antenna unit controller is connected to the reconfigurable antenna under test in the anechoic chamber. The radio frequency instrument is connected to a probe antenna in the anechoic chamber. The test controller is configured to control a test of the reconfigurable antenna by controlling the antenna unit controller to sequentially reconfigure electronically the reconfigurable antenna under test into a predetermined subset of configurations selected from a plurality of potential configurations, and by controlling the radio frequency instrument to communicate using wireless communications with the reconfigurable antenna under test via the probe antenna in each configuration of the predetermined subset of configurations while the reconfigurable antenna remains in the anechoic chamber. The classifier receives and classifies data collected by the test controller in response to the wireless communications between the reconfigurable antenna under test and the probe antenna in each configuration of the predetermined subset of configurations to characterize performance of the reconfigurable antenna under test. The test comprises measuring predetermined characteristics of radiation patterns resulting from each configuration of the predetermined subset of configurations to produce measured characteristics and providing the measured characteristics to the classifier as the collected data. The classifier compares the measured characteristics of each radiation pattern against predetermined thresholds to produce classification data and classifies the reconfigurable antenna under test according to performance quality based on the classification data. The predetermined thresholds for each radiation pattern are established through previous testing of test antennas in each of the plurality of potential configurations.

According to an aspect of the present disclosure, a method for testing a reconfigurable antenna in an anechoic chamber includes accepting a connection from a first reconfigurable antenna in an anechoic chamber to an antenna unit controller. Reconfigurations of the first reconfigurable antenna are electronically controlled into each configuration of a predetermined subset of configurations selected from a plurality of potential configurations, while the first reconfigurable antenna remains in the anechoic chamber. The probe antenna in the anechoic chamber is controlled to communicate using wireless communications with the first reconfigurable antenna in each configuration of the predetermined subset of configurations while the first reconfigurable antenna remains in the anechoic chamber, during a first test. Data corresponding to responses of the first reconfigurable antenna to the wireless communications is collected in each configuration of the predetermined subset of configurations. The collected data is classified to characterize performance of the first reconfigurable antenna. The first test comprises measuring predetermined characteristics of radiation patterns resulting from each configuration of the predetermined subset of configurations to produce measured characteristics, providing the measured characteristics as the collected data, and comparing the measured characteristics of each radiation pattern against predetermined thresholds to classify the collected data. The predetermined thresholds are established through previous testing of test antennas in each of the plurality of potential configurations.

The method may also include accepting a connection from a second reconfigurable antenna in the anechoic chamber to the antenna unit controller; controlling electronically reconfigurations of the second reconfigurable antenna into each configuration of the predetermined subset of configurations, while the second reconfigurable antenna remains in the anechoic chamber; controlling the probe antenna in the anechoic chamber to communicate using wireless communications with the second reconfigurable antenna in each configuration of the predetermined subset of configurations while the second reconfigurable antenna remains in the anechoic chamber, during a second test; collecting data corresponding to responses of the second reconfigurable antenna to the wireless communications in each configuration of the predetermined subset of configurations; and classifying the collected data to characterize performance of the second reconfigurable antenna.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A system for testing a reconfigurable antenna under test in an anechoic chamber, the system comprising:
   an antenna unit controller connected to the reconfigurable antenna under test in the anechoic chamber;
   a radio frequency instrument connected to a probe antenna in the anechoic chamber;
   a test controller configured to control a test of the reconfigurable antenna by controlling the antenna unit controller to sequentially reconfigure electronically the reconfigurable antenna under test into a predetermined subset of configurations selected from a plurality of potential configurations, and by controlling the radio frequency instrument to communicate using wireless communications with the reconfigurable antenna under test via the probe antenna in each configuration of the predetermined subset of configurations while the reconfigurable antenna remains in the anechoic chamber; and
   a classifier that receives and classifies data collected by the test controller in response to the wireless communications between the reconfigurable antenna under test and the probe antenna in each configuration of the predetermined subset of configurations to characterize performance of the reconfigurable antenna under test,
   wherein the test comprises measuring predetermined characteristics of radiation patterns resulting from each configuration of the predetermined subset of configurations to produce measured characteristics and providing the measured characteristics to the classifier as the collected data, the classifier comparing the measured characteristics of each radiation pattern against predetermined thresholds to produce classification data and classifying the reconfigurable antenna under test according to performance quality based on the classification data, and
   wherein the predetermined thresholds for each radiation pattern are established through previous testing of test antennas in each of the plurality of potential configurations.

2. The system of claim 1,
   wherein the anechoic chamber remains sealed throughout the test while reconfiguring the reconfigurable antenna under test to the predetermined subset of configurations.

3. The system of claim 1, further comprising:
   the anechoic chamber; and
   the probe antenna under control of the radio frequency instrument.

4. The system of claim 1, wherein the classifier calculates a score from the classification data, the score determining whether the reconfigurable antenna under test passes.

5. The system of claim 1, wherein the classification data comprises a result of comparing a measurement of power for each of the predetermined subset of configurations with a predetermined threshold of measurement power for each of the predetermined subset of configurations.

6. The system of claim 1,
wherein the test controller controls the test using feedback from the probe antenna received via the radio frequency instrument.

7. The system of claim 1,
wherein the reconfigurable antenna under test is logically reconfigurable.

8. The system of claim 1,
wherein the reconfigurable antenna under test is placed automatically in the anechoic chamber for the test, and removed automatically from the anechoic chamber after the test.

9. The system of claim 1,
wherein the probe antenna is provided in a probe array of a plurality of probe antennas.

10. The system of claim 1,
wherein the reconfigurable antenna comprises a reconfigurable array of antennas.

11. The system of claim 1,
wherein the test controller sequences a process for the test, and collects measurement data during the test from the probe antenna via the radio frequency instrument and from the reconfigurable antenna via the antenna unit controller, and provides the collected measurement data to the classifier as the collected data.

12. A method for testing a reconfigurable antenna in an anechoic chamber, the method comprising:
accepting a connection from a first reconfigurable antenna in an anechoic chamber to an antenna unit controller;
controlling electronically reconfigurations of the first reconfigurable antenna into each configuration of a predetermined subset of configurations selected from a plurality of potential configurations, while the first reconfigurable antenna remains in the anechoic chamber;
controlling a probe antenna in the anechoic chamber to communicate using wireless communications with the first reconfigurable antenna in each configuration of the predetermined subset of configurations while the first reconfigurable antenna remains in the anechoic chamber, during a first test; and
collecting data corresponding to responses of the first reconfigurable antenna to the wireless communications in each configuration of the predetermined subset of configurations; and
classifying the collected data to characterize performance of the first reconfigurable antenna,
wherein the first test comprises measuring predetermined characteristics of radiation patterns resulting from each configuration of the predetermined subset of configurations to produce measured characteristics, providing the measured characteristics as the collected data, and comparing the measured characteristics of each radiation pattern against predetermined thresholds to classify the collected data, and
wherein the predetermined thresholds are established through previous testing of test antennas in each of the plurality of potential configurations.

13. The method for testing the reconfigurable antennas of claim 12, further comprising:
accepting a connection from a second reconfigurable antenna in the anechoic chamber to the antenna unit controller;
controlling electronically reconfigurations of the second reconfigurable antenna into each configuration of the predetermined subset of configurations, while the second reconfigurable antenna remains in the anechoic chamber;
controlling the probe antenna in the anechoic chamber to communicate using wireless communications with the second reconfigurable antenna in each configuration of the predetermined subset of configurations while the second reconfigurable antenna remains in the anechoic chamber, during a second test;
collecting data corresponding to responses of the second reconfigurable antenna to the wireless communications in each configuration of the predetermined subset of configurations; and
classifying the collected data to characterize performance of the second reconfigurable antenna.

14. The method for testing reconfigurable antennas of claim 13, further comprising:
automatically loading and unloading the first reconfigurable antenna and the second reconfigurable antenna into the anechoic chamber, respectively.

15. The method for testing reconfigurable antennas of claim 12, further comprising:
controlling the first test by sequentially measuring communications between the first reconfigurable antenna and the probe antenna via the antenna unit controller and a radio frequency instrument.

16. The method for testing reconfigurable antennas of claim 13,
wherein the first reconfigurable antenna and the second reconfigurable antenna each comprise a reconfigurable antenna array.

17. The method for testing reconfigurable antennas of claim 16, further comprising:
sending a result of the classification as a classification result for a decision whether the first reconfigurable antenna passes the first test, fails the first test, or needs to be retested.

18. The method for testing reconfigurable antennas of claim 13,
wherein the probe antenna is provided in a probe array of a plurality of probe antennas, and
wherein the probe array comprises an array of fixed probe antennas fixed in the anechoic chamber through tests of the first reconfigurable antenna and the second reconfigurable antenna.

19. The method for testing reconfigurable antennas of claim 12,
wherein the first test is performed using mid-field scanning.

20. The method for testing reconfigurable antennas of claim 12,
wherein the first test is performed by reconfiguring the reconfigurable antenna while the reconfigurable antenna is sealed in the anechoic chamber.

* * * * *